US007215140B1

(12) United States Patent
Saini et al.

(10) Patent No.: US 7,215,140 B1
(45) Date of Patent: May 8, 2007

(54) PROGRAMMABLE LOGIC DEVICE HAVING REGIONS OF NON-REPAIRABLE CIRCUITRY WITHIN AN ARRAY OF REPAIRABLE CIRCUITRY AND ASSOCIATED CONFIGURATION HARDWARE AND METHOD

(75) Inventors: Rahul Saini, Union City, CA (US); Andy Lee, San Jose, CA (US); Ninh Ngo, San Jose, CA (US)

(73) Assignee: Altera Corporation, San Jose, CA (US)

( * ) Notice: Subject to any disclaimer, the term of this patent is extended or adjusted under 35 U.S.C. 154(b) by 725 days.

(21) Appl. No.: 10/452,673

(22) Filed: May 30, 2003

(51) Int. Cl.
*H03K 19/177* (2006.01)
(52) U.S. Cl. .............................. 326/41; 326/12; 326/47
(58) Field of Classification Search .................. 326/10, 326/37–41, 47, 12; 716/2, 16–17
See application file for complete search history.

(56) References Cited

U.S. PATENT DOCUMENTS

| | | | |
|---|---|---|---|
| 4,899,067 A | 2/1990 | So et al. | |
| 5,260,611 A | 11/1993 | Cliff et al. | |
| 5,369,314 A | 11/1994 | Patel et al. | |
| 5,434,514 A | 7/1995 | Cliff et al. | |
| 5,459,342 A | 10/1995 | Nogami et al. | |
| 5,592,102 A | 1/1997 | Lane et al. | |
| 5,777,887 A | 7/1998 | Marple et al. | |
| 5,926,036 A | 7/1999 | Cliff et al. | |
| 6,034,536 A | 3/2000 | McClintock et al. | |
| 6,107,820 A | 8/2000 | Jefferson et al. | |
| 6,167,558 A * | 12/2000 | Trimberger ................... | 716/16 |
| 6,201,404 B1 * | 3/2001 | Reddy et al. .................. | 326/10 |
| 6,344,755 B1 * | 2/2002 | Reddy et al. .................. | 326/10 |
| 6,404,226 B1 | 6/2002 | Schadt | |
| 6,545,501 B1 | 4/2003 | Bailis et al. | |
| 6,600,337 B2 | 7/2003 | Nguyen et al. | |
| 6,605,962 B2 | 8/2003 | Lee et al. | |
| 6,965,249 B2 * | 11/2005 | Lane et al. .................... | 326/10 |
| 2001/0006347 A1 | 7/2001 | Jefferson et al. | |
| 2002/0166106 A1 | 11/2002 | Lewis et al. | |
| 2003/0072185 A1 | 4/2003 | Lane et al. | |
| 2005/0264318 A1 * | 12/2005 | Chan et al. .................... | 326/41 |

OTHER PUBLICATIONS

Hatori, F. et al. (1993) "Introducing Redundancy in Field Programmable Gate Arrays," IEEE Custom Integrated Circuits Conference, pp. 7.1.1-7.1.4.
U.S. Appl. No. 10/140,287, filed May 6, 2002, Lewis et al.
U.S. Appl. No. 10/140,911, filed May 6, 2002, Johnson et al.
U.S. Appl. No. 10/159,581, filed May 30, 2002, Lane et al.
U.S. Appl. No. 10/289,629, filed Nov. 6, 2002, Johnson et al.
Kluwer Academic Publishers, Vaughn Betz, Jonathan Rose, Alexander Marquardt, *Architecture and CAD for Deep-Submicron FPGAs*, Chapter 2.1 (pp. 11-18), Chapter 4 (pp. 63-103), Chapter 5 (pp. 105-126), and Chapter 7 (pp. 151-190), (Mar. 1999).

* cited by examiner

*Primary Examiner*—Rexford Barnie
*Assistant Examiner*—Jason Crawford
(74) *Attorney, Agent, or Firm*—Beyer Weaver LLP

(57) ABSTRACT

An embodiment of the present invention provides a programmable logic device ("PLD") including one or more dedicated blocks of circuitry within one or more repairable logic array regions. Aspects of the present invention provide circuitry and methods for controlling shifting of programming data in normal and redundant modes for both dedicated block regions and fully repairable logic array regions during both regular and test programming sequences of a PLD. Other aspects provide circuitry and methods for interface routing between dedicated blocks and repairable logic array regions in both normal and redundant modes. Various other aspects are also disclosed.

45 Claims, 24 Drawing Sheets

NORMAL MODE

| | | | | | | | | | | |
|---|---|---|---|---|---|---|---|---|---|---|
| $R_n$ → LAB | LAB | LAB | LAB | LAB | LAB | LAB | LAB | LAB | LAB | (m) |
| $R_{n+1}$ → SPARE | SPARE | SPARE | SPARE | SPARE | SPARE | SPARE | SPARE | SPARE | SPARE | |
| $R_{n+2}$ → LAB | 115 | | LAB | LAB | | | LAB | LAB | (m+1) |
| $R_{n+3}$ → LAB | DEDICATED BLOCK (Frames partially repairable) 150 | | LAB | LAB | | DEDICATED BLOCK (Frames not repairable) 160 | | LAB | LAB | (m+2) |
| $R_{n+4}$ → LAB | | | LAB | LAB | | | LAB | LAB | (m+3) |
| $R_{n+5}$ → LAB | | | LAB | LAB | | | LAB | LAB | (m+4) |
| $R_{n+6}$ → LAB | 110 | | LAB | LAB | | | LAB | LAB | (m+5) |
| $R_{n+7}$ → LAB | | | LAB | LAB | | | LAB | LAB | (m+6) |
| $R_{n+8}$ → LAB | | | LAB | LAB | | | LAB | LAB | (m+7) |
| $R_{n+9}$ → LAB | | | LAB | LAB | | | LAB | LAB | (m+8) |
| $R_{n+10}$ → LAB | LAB | LAB | LAB | LAB | LAB | | | LAB | LAB | (m+9) |
| $R_{n+11}$ → LAB | LAB | LAB | LAB | LAB | LAB | | | LAB | LAB | (m+10) |
| $R_{n+12}$ → SPARE | SPARE | SPARE | SPARE | SPARE | SPARE | SPARE | SPARE | SPARE | SPARE | |
| $R_{n+13}$ → LAB | LAB | LAB | LAB | LAB | LAB | LAB | LAB | LAB | LAB | (m+11) |
| $R_{n+14}$ → LAB | LAB | LAB | LAB | LAB | LAB | LAB | LAB | LAB | LAB | (m+12) |

Test Normal Mode, Programming

PROGRAMMABLE LOGIC DEVICE HAVING REGIONS OF NON-REPAIRABLE CIRCUITRY WITHIN AN ARRAY OF REPAIRABLE CIRCUITRY AND ASSOCIATED CONFIGURATION HARDWARE AND METHOD

BACKGROUND OF THE INVENTION

1. Field of the Invention

The present invention relates to programmable logic devices having redundant circuitry.

2. Description of Related Art

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs typically include blocks of logic elements, sometimes referred to as logic array blocks ("LABs"; also referred to by other names, e.g., "configurable logic blocks," or "CLBs"). Logic elements ("LEs", also referred to by other names, e.g., "logic cells") may include a look-up table (LUT) or product term, carry-out chain, register, and other elements. LABs (comprising multiple LEs) may be connected to horizontal and vertical conductors that may or may not extend the length of the PLD.

PLDs have configuration elements that may be programmed or reprogrammed. Configuration elements may be realized as RAM bits, flip-flops, EEPROM cells, or other memory elements. Placing new data into the configuration elements programs or reprograms the PLD's logic functions and associated routing pathways. Configuration elements that are field programmable are often implemented as RAM cells (sometimes referred to a "CRAM" or "configuration RAM"). However, many types of configurable elements may be used including static or dynamic random access memory, electrically erasable read-only memory, flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "configuration element" will be used to refer to any programmable element that may be configured to determine functions implemented by other PLD elements.

In some PLDs, the configuration elements are located in a dedicated memory region or regions. In other PLDs, the configuration elements are dispersed throughout the device. In either case, the configuration elements are often treated together as an addressable array, or grid, that may be programmed with configuration data.

PLDs having redundant circuitry can help improve production yields by providing regions on the device that can be repaired by engaging the redundant circuitry. A row based redundancy scheme provides at least one redundant or "spare" row in an array of logic circuitry (e.g. an array of LABs and associated routing). Row based redundancy schemes are described, for example, in commonly assigned U.S. Pat. No. 6,201,404 (entitled "Programmable Logic Device with Redundant Circuitry") and U.S. Pat. No. 6,344,755 (entitled "Programmable Logic Device with Redundant Circuitry") and are further described in commonly assigned pending U.S. patent application Ser. No. 10/159,581 (entitled "Programmable Logic Device with Redundant Circuitry"). A repairable region may be defined above the spare row such that, if one of the rows of the logic array is defective, the spare row is activated and each row from the spare row to the bad row replaces the next higher row, thus repairing the defective region.

As the need for high performance in specialized applications grows, it is increasingly useful to provide one or more dedicated blocks designed to serve particular purposes within an array of more general purpose programmable logic circuitry. Aspects of the placement of such dedicated blocks in a logic array are described, for example, in the following commonly assigned pending applications: U.S. patent application Ser. No. 10/057,442 (entitled "PLD Architecture for Flexible Placement of IP Function Blocks") and U.S. patent application Ser. No. 10/140,911 (entitled "Use of Dangling Partial Lines for Interfacing in a PLD").

In many instances, however, it is not practical or feasible to provide dedicated blocks that also have redundant circuitry and are repairable through a redundancy scheme. It is nevertheless still desirable to implement redundancy schemes to provide repairable regions of circuitry in a logic array outside of or between regions of dedicated block circuitry.

Thus there is a need to provide a PLD that has repairable regions that may be repaired by invoking a redundancy scheme for a logic array of the PLD but that also includes dedicated blocks of circuitry that may not be repairable. There is a need for a PLD in which such dedicated block regions may be provided that are not repairable while a redundancy scheme in a surrounding logic array may nevertheless be implemented that allows the dedicated block to be programmed with and interface to the surround logic array in normal and redundant modes of the PLD.

As PLDs become more dense, there is also an increasing need to verify data in PLD configuration elements to determine whether elements have flipped values due to environmental or other effects. There is an increasing need to perform such verification during regular operation of the PLD. At the same time, it is desirable, when possible, to reuse signals that are generated to control data shifting during PLD programming to also control other aspects of redundancy during regular (or "user mode") operation of the programmed PLD. For example, vertical routing to rows may be affected by whether a redundant mode triggering row shifting is engaged. As another example, routing to and from I/O pins along a side of the chip (for example, corresponding to the ends of logic rows) may be effected by whether or not redundancy is engaged to shift rows. In the case of these and other examples, elements to control redundancy within the core or within the I/O areas of the PLD (e.g. tri-state buffers, multiplexors, or other elements used to route signals within the PLD) may need to receive redundancy control signals to properly implement a row-based or other redundancy scheme. However, when dedicated blocks or other regions are present that do not necessarily follow the same pattern of row shifting in a redundant mode as is followed by sur rounding regions of a logic array, redundancy control signals used to control programming or during verification may be dynamic rather than fixed (e.g. depending on which portion of the device is presently being programmed). However, if such signals are to be reused during a user mode to control various non-programming aspects of redundancy, it is desirable to provide fixed rather than dynamic values of those signals. Thus, there is a need to reuse redundancy control signals used for programming while still providing fixed signal values during a user mode for various aspects of redundancy control (e.g. core and I/O routing).

SUMMARY OF THE INVENTION

In one aspect, an embodiment of the present invention provides a programmable logic device ("PLD") including one or more dedicated blocks of circuitry within one or more repairable logic array regions. In another aspect, an embodiment of the present invention provides circuitry to facilitate shifting of configuration data for programming repairable portions of the logic array in a redundant mode without shifting configuration data for programming the one or more dedicated blocks.

In another aspect, an embodiment of the present invention provides detection circuitry that identifies, during a programming sequence of the PLD, partially repairable or non-repairable frame portions of a configuration grid that span a dedicated block. In another aspect, the detection circuitry is programmably coupled to address register elements to detect frames spanning a dedicated block either earlier or later in a programming sequence or verification sequence depending on characteristics of the programming or verification sequence.

In another aspect, an embodiment of the present invention includes control circuitry coupled to receive dedicated block detection signals from the detection circuitry during a programming sequence, the control circuitry controlling redundancy row shifting of configuration data based in part on the dedicated block detection signals. In another aspect, the control circuitry registers the dedicated block detection cycles in a pipeline register at least one clock cycle prior to using the detection signals to control row shifting, thus helping to reduce potential timing problems associated with a lengthy signal pathway between detection circuitry proximate to the address register and control circuitry proximate to the data register.

In another aspect, control circuitry for each row of a logic array is coupled to switching circuitry to control row shifting of configuration data loaded for a corresponding row during a regular programming sequence. In another aspect, the control circuitry is also coupled to switching circuitry to control, during test programming, redundancy row shifting of test configuration data received from test input pins and routed to data register portions for test programming of a core configuration grid. In a related aspect, the control circuitry is also coupled to switching circuitry to control, during the verification phase of test programming, redundancy row shifting of test configuration data routed from the data register and to test output pins.

In another aspect, an embodiment of the present invention includes circuitry coupled to register and hold values of redundancy control signals at the end of a programming sequence and to provide those signals as fixed signals during a user mode to control routing and other redundancy elements. The circuitry provides registered signals that are fixed even though those signals are originally derived from signals that toggle during programming and also toggle during a verification sequence operable during the user mode.

In another aspect, an embodiment of the present invention includes interface switching circuitry to provide interface routing between a dedicated block and a logic array in both normal and redundant modes. The interface switching allows rows shifting in the logic array to occur in a redundant mode without disrupting routing between non-shifting blocks and rows of the logic array.

BRIEF DESCRIPTION OF THE DRAWINGS

The novel features of the invention are set forth in the appended claims. However, for purpose of explanation, several aspects of a particular embodiment of the invention are described by reference to the following figures.

FIG. 2 illustrates the relationship between rows of configuration data and rows of the logic array illustrated in FIG. 1 when the illustrated portion of the PLD is operating in a "normal," non-redundant mode.

FIG. 8 illustrates aspects of register and selector circuitry that allow redundancy routing elements to reuse signals generated for regular and test programming while being shielded during a user mode from signal toggling associated with an error detection feature.

DETAILED DESCRIPTION OF THE EXEMPLARY EMBODIMENTS

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
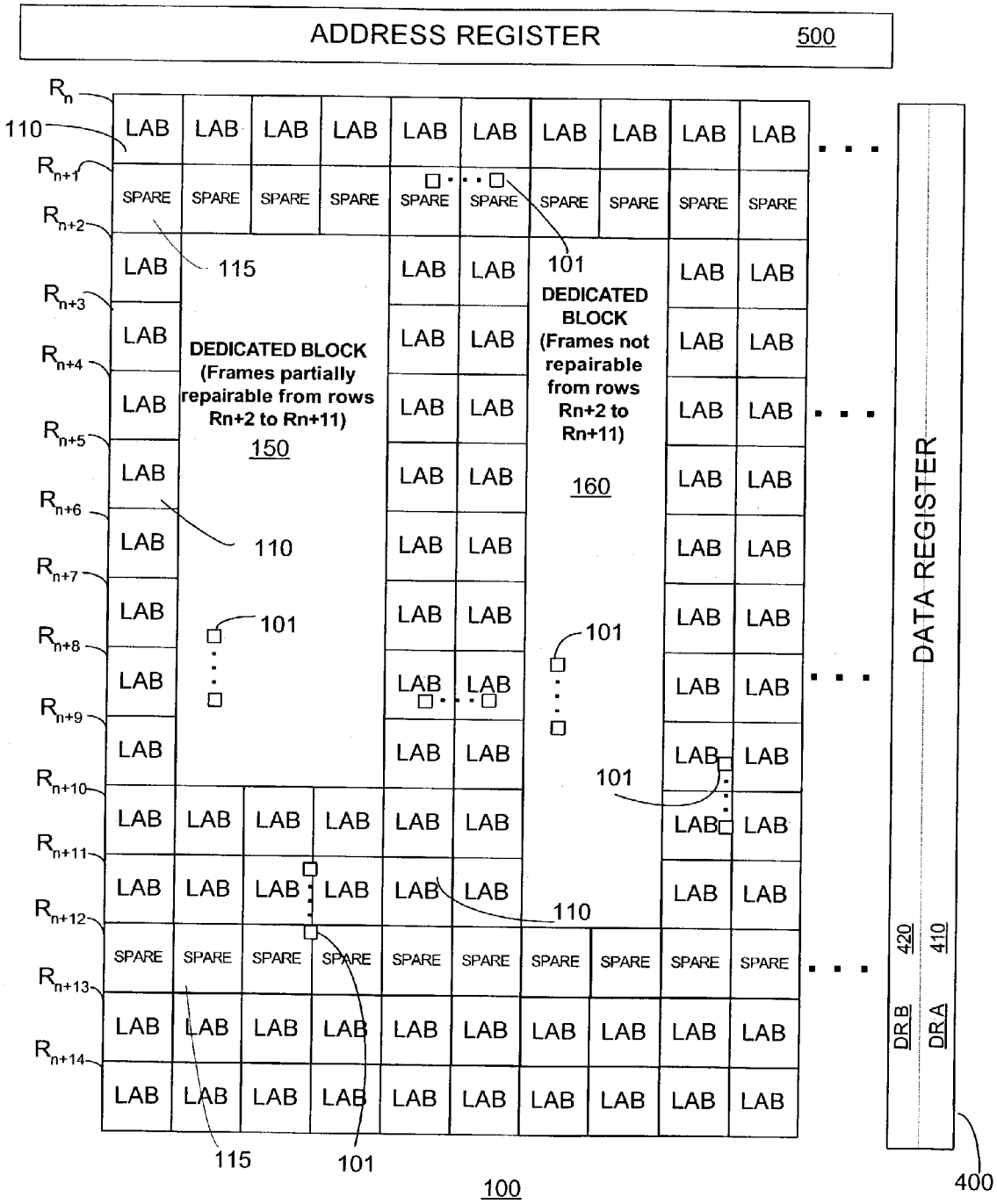
FIG. 1 illustrates a portion of a PLD in accordance with an embodiment of the present invention.

FIG. 1 illustrates a portion of a PLD 100 in accordance with an embodiment of the present invention. PLD 100 includes an array of logic circuitry comprising LABs 110. LABs 110 are arranged in a plurality of rows from row Rn to row Rn+14. The illustrated logic array also includes spare rows of circuitry including spare LABs 115. As illustrated, rows Rn+1 and Rn+12 are spare rows. Repairable regions of the logic array are defined above each spare row. For example, LAB rows Rn+2 to Rn+11 are "repairable" in the sense that if a LAB in one of those rows is defective, configuration data for the LABs and associated routing in rows from the bad row to the spare row Rn+12 may be "shifted" such that, for example, Rn+12 replaces row Rn+11, Rn+11 replaces row Rn+10, etc., until the bad row is replaced.

Interposed within the logic array (comprising LABs 110) are dedicated blocks 150 and 160. Dedicated blocks 150 and 160 may comprise any one of various blocks of circuitry that are not part of the logic array of LABs. For example, block 150 may comprise a "Mega Random Access Memory" block ("MRAM") and block 160 may comprise a "multiply-accumulator" ("MAC") block. However, other dedicated blocks are possible. For example, various digital signal processing blocks may be provided that are designed to perform particular types of logic functions.

The circuitry of PLD 100 may be programmed by loading configuration data into configuration elements 101. Configuration elements 101 may configure various aspects of PLD 100. For example, elements 101 may be used to program the functions that are implemented by logic elements (LEs) that exist in each LAB. As another example, configuration elements may also be used to program various routing connections within or between the LABs of a particular row, between LABs of different rows, or between LABs and dedicated blocks. Although dedicated blocks are typically more specialized than circuitry in the LAB array, dedicated blocks also may have programmable circuitry, as reflected by the illustration of configuration elements 101 located within blocks 150 and 160.

Configuration elements 101 are coupled to data and address lines and form a large array or "grid" of configuration elements (address and data lines not separately shown). The rows and columns of the configuration grid do not necessarily correspond to the rows and columns of the logic array of LABs. For example, each column of LABs may include and span several columns of the configuration grid. Also, several rows of configuration elements may exists in a single LAB row. To avoid confusion, columns of configuration elements in the configuration grid will be referred to herein as "frames" as will an associated columns of data loaded into such a frame. Furthermore, the term "frame" is sometimes used herein to refer to the portion of a frame in a single repairable region rather than an entire column of data or configuration elements within a configuration grid spanning multiple repairable regions.

The grid of configuration elements 101 of the PLD portion shown is programmed by address register 500 and data register 400. Data register 400 includes both a shift register ("DRA") 410 and a parallel loaded register ("DRB") 420 (DRA 410 and DRB 420 are further illustrated and described in FIGS. 4a–4d and accompanying text). In one exemplary sequence, programming is carried out on a frame-by-frame basis across the configuration grid (comprising elements 101) as follows: (i) a frame of configuration data is shifted into DRA 410 of data register 400; (ii) the frame is then parallel loaded into DRB 420 of data register 400; (iii) a frame is "asserted" by address register 500 which triggers parallel loading of data from DRB 420 of data register 400 into the asserted frame of configuration elements; i.e., a register element of address register 500 that is coupled to configuration elements in a frame of the configuration grid provides a high value which opens connections between that frame of the configuration grid and data lines coupled to DRB 420 (data lines not separately shown).

FIG. 2 illustrates the relationship between rows of configuration data and rows of the logic array illustrated in FIG. 1 when the illustrated portion of PLD 100 is operating in a "normal," non-redundant mode. The logic array rows are labeled Rn thru Rn+14. The "rows" of configuration data are represented by the dashed lines and are numbered from (m) to (m+12). Note that a row of configuration data includes all the configuration data for a particular logic array row (including data used to program the portion of a dedicated block in that row). As previously indicated, and as will be understood more clearly in the context of FIGS. 4a–4d and accompanying text, configuration data for a single LAB row may include data for several rows of configuration elements 101 in the configuration grid.

Figure 3:
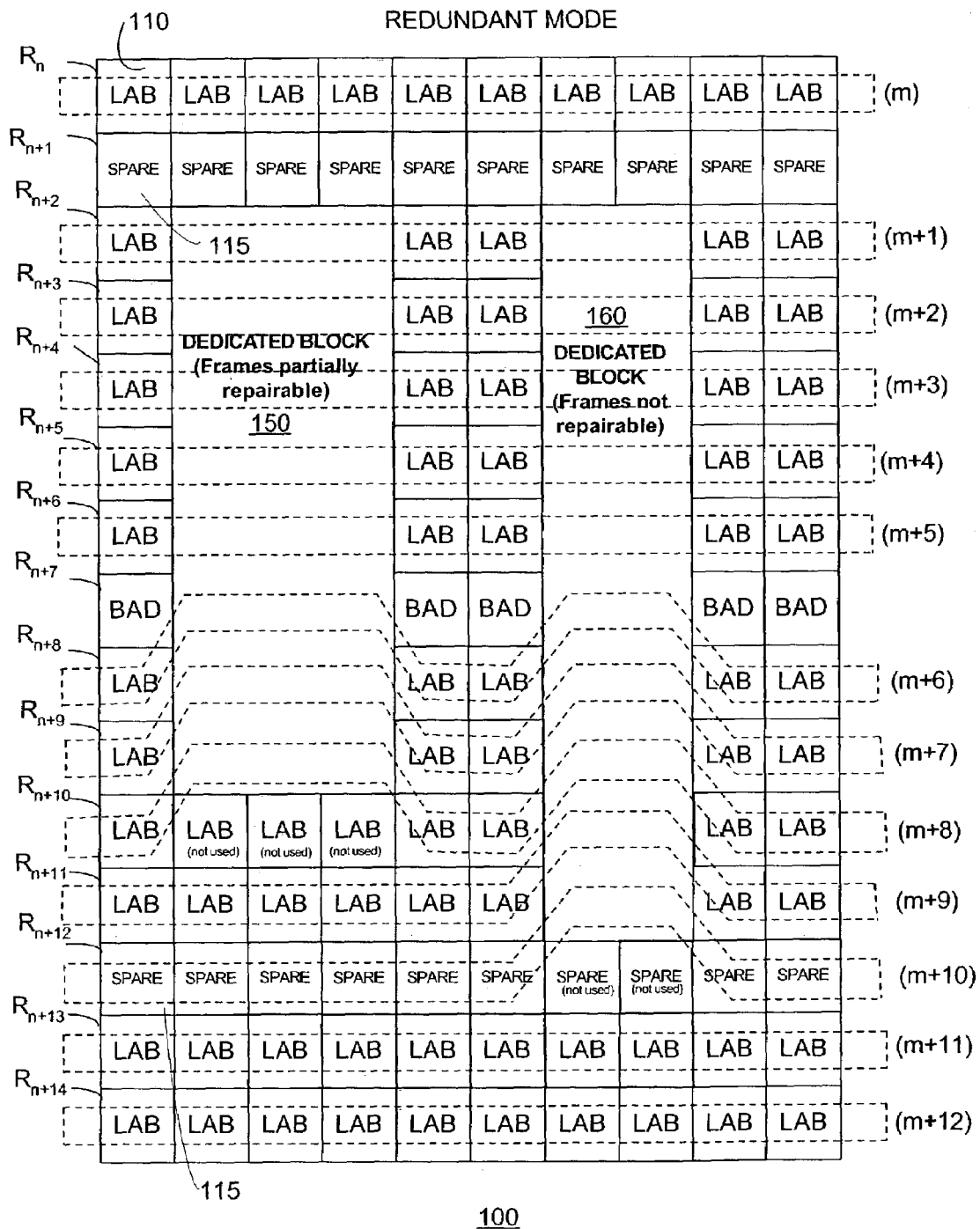
FIG. 3 illustrates the relationship between rows of configuration data and rows of the logic array illustrated in FIG. 1 when the illustrated portion of the PLD is operating in a redundant mode.

FIG. 3 illustrates the relationship between rows of configuration data and rows of the logic array illustrated in FIG. 1 when the illustrated portion of PLD 100 is operating in a redundant mode between row Rn+7 and spare row Rn+12. In the illustration of FIG. 3, row Rn+7 is bad. Repair is effected through row "shifting" from the bad row to the spare row as follows: row Rn+8 is used in place of row Rn+7, row Rn+9 is used in place of row Rn+8, row Rn+10 in place of row Rn+9, row Rn+11 in place of row Rn+10 and spare row Rn+12 is used in place of row Rn+11. As part of accomplishing this shifting, the configuration data for programming this portion of PLD 100 is shifted so that the data provided to one row in normal mode is instead provided to another row in the redundant mode. However, row shifting does not occur in the dedicated blocks, thus the data provided to a portion of a dedicated block that corresponds to a particular row in normal mode is provided to that same portion of the dedicated block in redundant mode. This redundant mode shifting in LAB regions and non-shifting in dedicated block regions is illustrated by comparing the location of data (m+6), (m+7), (m+8), (m+9), and (m+10) in FIG. 2 to the location of that data in FIG. 3.

As illustrated, the data (m+6), (m+7), (m+8), (m+9), and (m+10) provided to, respectively, rows Rn+7, Rn+8, Rn+9, Rn+10, and Rn+11 in normal mode (FIG. 2) is, in redundant mode (FIG. 3), instead provided to, respectively, rows Rn+8, Rn+9, Rn+10, Rn+11 and spare row Rn+12 in the LAB 110 regions of those rows. However, as illustrated, the data (m+6), (m+7), and (m+8) is not shifted for the dedicated block 150 portion of rows Rn+7, Rn+8, and Rn+9 so that those portions of dedicated block 150 receive the same configuration data in normal mode (FIG. 2) and redundant mode (FIG. 3). Furthermore, the data (m+6), (m+7), (m+8), (m+9), and (m+10) is also not shifted for the dedicated block 160 portions of rows Rn+7, Rn+8, Rn+9, Rn+10, and Rn+11.

In the embodiment illustrated, the three LAB regions 110 (marked "not used") in row Rn+10, just below dedicated block 150, are not used in the redundant mode; these LABs are not needed in the redundant mode as circuitry in dedicated block 150 is not being repaired through row shifting. Furthermore, because the adjacent logic regions are being repaired through row shifting, not using the indicated LABs 110 below block 150 allows rows to regain alignment below block 150 relative to the rest of the logic array by row Rn+11 as indicated. As will be appreciated by those skilled in the art, it is also possible, in an alternative embodiment, to use the LABs immediately below a dedicated block (such as block 150) in the redundant mode but then not use LABs in the same portion of one of the other rows below the dedicated block (e.g., referring to FIG. 3, LABs in rows Rn+11 or Rn+12 just below those marked "not used"). However, as will be clearer in the context of FIGS. 9*a*–*d* and accompanying text, such an alternative would require additional switching circuitry for redundant routing connections within replacement rows, and thus the embodiment illustrated in FIG. 3 is presently preferred relative to such an alternative. However, such alternatives would not necessarily depart form the spirit and scope of the present invention.

FIGS. 4*a*–4*d* show further details of PLD 100 of FIG. 1, and, in particular, illustrate control and switching circuitry coupled to data register 400 to accomplish the shifting of configuration data illustrated in FIGS. 2–3 for normal and redundant modes in logic array rows Rn+6 thru Rn+13.

Figure 4A:
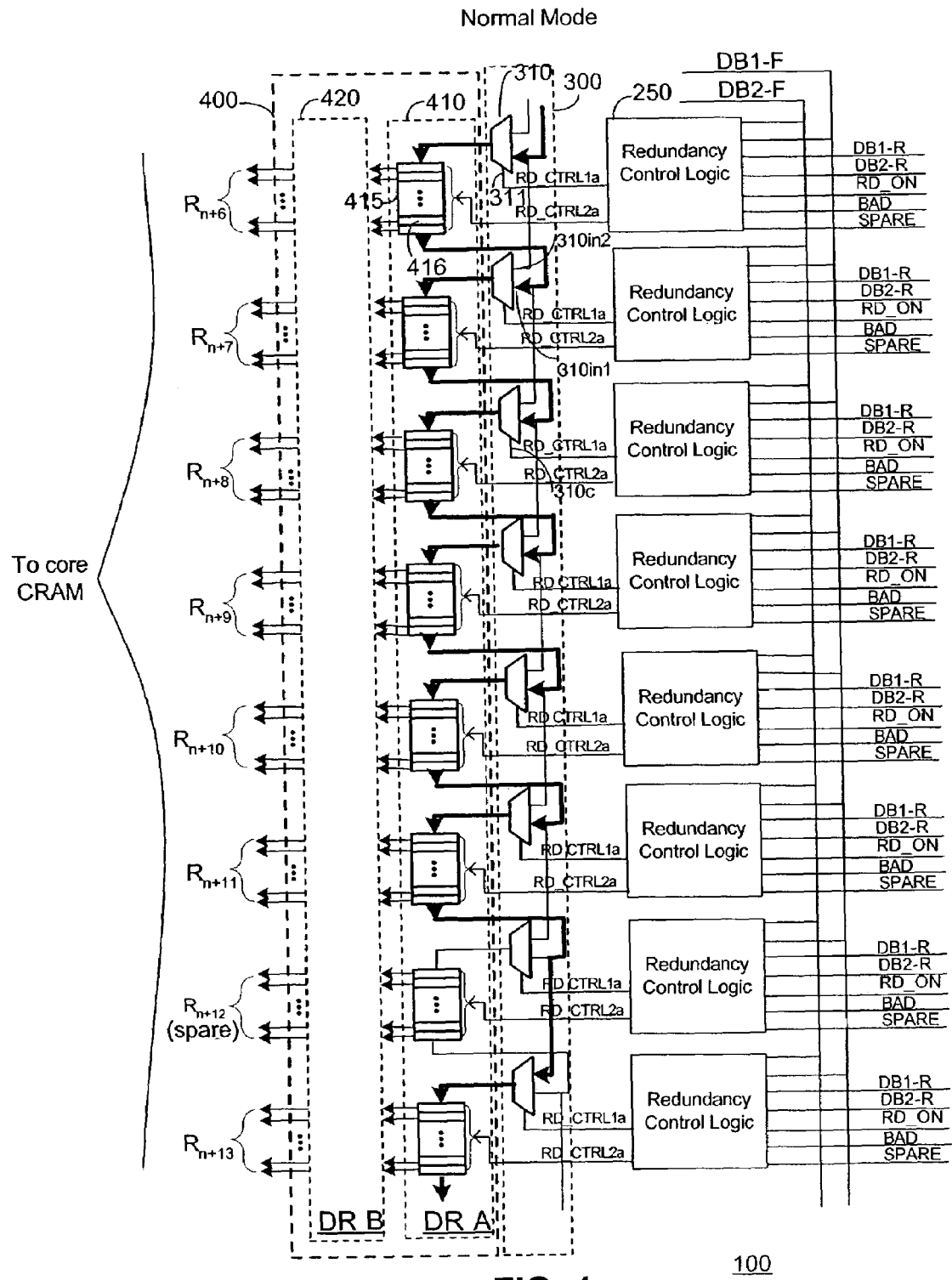
FIGS. 4a–4d show further details of the PLD of FIG. 1 and, in particular, illustrate programming circuitry including switching circuitry coupled to a data register, the switching circuitry and the data register receiving control signals to accomplish the shifting of configuration data illustrated in FIGS. 2–3 for normal and redundant modes in exemplary logic array rows.

Referring to FIG. 4*a*, programming circuitry includes data register 400 and switching circuitry 300. Shift register DRA 410 of data register 400 includes shift segments 415. Each shift segment 415 includes shift elements 416 for holding configuration bits for programming configuration elements 101 (configuration elements 101 are referenced in FIG. 1 and accompanying text). Each shift segment 415, when loaded, holds configuration data for a corresponding logic array row (e.g. Rn+7, Rn+8, etc.). With reference to the grid of configuration elements (comprising configuration elements 101), data corresponding to one frame is held by register DRA 410 at a particular time. As previously described in the context of FIG. 1, after a frame of data is shifted into DRA 410, the data is then parallel loaded into register DRB 420 as indicated by the arrows in FIG. 4*a* between register DRA 410 and register DRB 420 for subsequent loading in the core grid of configuration elements.

Continuing with the description of FIG. 4*a*, switching circuitry 300 is coupled to shift segments 415 of register DRA 410. Exemplary switching circuitry 300 includes muxes 310. Muxes 310 include data inputs 310*in*-1 and 310*in*-2 and control input 310*c*. Each mux 310 receives a redundancy control signal RD_CTRL1*a* from a redundancy control logic circuit 250. Each RD_CTRL1*a* signal controls a mux 310 to select either (i) input 310*in*-1 or (ii) input 310*in*-2. Each RD_CTRL2*a* signal controls a shift segment 415 to either clear or not clear its data. When cleared, a shift segment 415 is filled with "0" values. Such a clear is consistent with effectively bypassing programming of that row. (Such a clear function can be implemented by a variety of alternative circuits not separately shown that are coupled to a shift segment 415 and responsive to signal RD_CTRL2*a*. Other alternatives are possible as well, e.g., applying a clear function to a corresponding portion of DRB 420, or modifying muxes 310 to add a third input tied to a ground value to be selected for row bypass, to cite just two alternatives; many other such alternatives will be apparent to those skilled in the art). Thus, together, signals RD_CTRL1*a* and RD_CTRL2*a* are used to implement three options with respect to a shift segment 415's receipt of data: (i) receive data from the shift segment 415 corresponding to the immediately preceding row (effected by controlling the corresponding mux 310 to select its input 310*in*-1) (ii) receive data from the shift segment 415 corresponding to the row preceding the immediately preceding row (effected by controlling the corresponding mux 310 to select its input 310*in*-2) or (iii) receive "0"s to implement a row bypass (effected by clearing the elements 416 of the shift segment 415).

Which selection is made depends upon several factors regarding the particular row corresponding to the shift segment 415. These factors may include the following: whether that particular row is a bad row, a spare row, a row below a spare row, a row in a region between a bad row and a spare row for which redundancy is engaged, or a row spanning a dedicated block for the frame of configuration data currently being loaded. Each redundancy control logic circuit 250 receives signals DB1-F, DB2-F, DB1-R, DB2-R, RD_ON, SPARE, and BAD. The relationship between these signals and redundancy control output signals such as RD_CTRL1 will be explained more fully below in the context of FIG. 6. However, the meaning of each input signal is noted in TABLE A:

TABLE A

| SIGNAL | MEANING (can be high or low) |
|---|---|
| DB1-F | Whether or not frame spans dedicated block 150. |
| DB2-F | Whether or not frame spans dedicated block 160. |
| DB1-R | Whether or not row spans dedicated block 150. |
| DB2-R | Whether or not row spans dedicated block 160. |
| RD_ON | Whether or not redundancy is engaged for that row (i.e. whether row is in a region that is being repaired, i.e., a region at or below a bad row and at or above the closest spare row below the bad row). |
| SPARE | Whether or not row is a spare row (i.e., at least the portion of the row outside of dedicated blocks is "spare" or redundant). |
| BAD | Whether or not row is a "bad row" (at least in some portion of the row outside of the dedicated blocks is considered damaged) and needs to be repaired through row shifting. |

The above Table A is reflective of signals for the presently illustrated example. However, in other examples, there may be a greater or lesser number of signals received by a redundancy control logic circuit. To cite but one alternative, if additional dedicated blocks were present, additional signals corresponding to each such block might be employed.

As illustrated in FIG. 4*a*, signals DB1-F and DB2-F are shared across the illustrated rows. The reason is that, at any given time, the shift segments 410 corresponding to those rows hold data corresponding to a particular frame, and thus, the same frame signals can be shared by each row. However, signals DB1-R, DB2-R, RD_ON, SPARE, and BAD are potentially unique for particular rows and thus are not shown as shared across rows in the particular illustrations of FIGS. 4*a*–4*d*. Nevertheless, as will be appreciated by those skilled in the art, these signals may, in some instances, also be shared across multiple rows.

Referring again to FIG. 4*a*, the bold arrows through muxes 310 of shifting circuitry 300 and through shift segments 415 of register DRA 410 illustrates data shifting in a normal mode for the portion of rows Rn+6 to Rn+13 corresponding to frames in fully repairable regions and also for frames in regions corresponding to dedicated blocks 150 and 160. Fully repairable regions correspond to the portions of the LAB array between and on either side of dedicated blocks 150 and 160 (as illustrated in FIGS. 1–3). As illustrated in FIG. 4a, in normal mode, muxes 310 are controlled such that data is shifted into each segment 415 from the segment 415 corresponding to the immediately preceding row for rows Rn+6 to Rn+11. However, because row Rn+12 is a spare row, the shift segment 415 corresponding to that row is bypassed in normal mode and the shift segment 415 corresponding to row Rn+13 receives data from the row Rn+11 shift segment 415 as shown. Note that even though data flows through the row Rn+12 mux into the row Rn+12 shift segment 415 in this mode, shift segment 415 is cleared under the control of signal RD_CTRL2a as previously described, thus the row Rn+12 shift segment 415 is illustrated as bypassed.

Figure 4B:
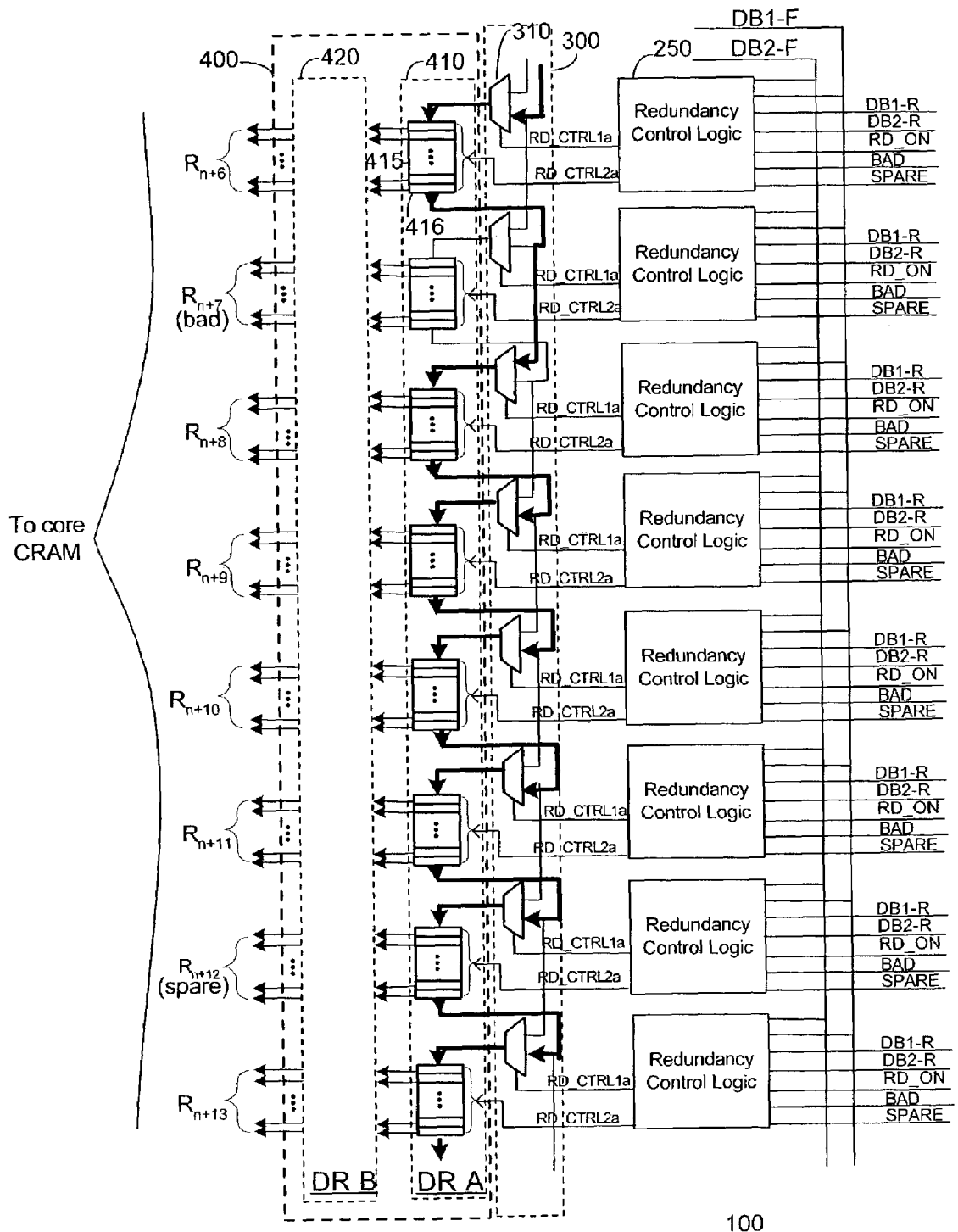

FIG. 4b illustrates data shifting in a redundant mode for fully repairable frames. In FIG. 4b, row Rn+7 is bad (meaning that at least some circuitry corresponding to that row is considered to be defective). As illustrated by the bold arrows through switching circuitry 300 and register DRA 410, for fully repairable frames, muxes 310 and the row Rn+7 shift segment 415 are controlled in the redundant mode such that row Rn+7 is bypassed. Thus the shift segment 415 for row Rn+8 receives input from the shift segment 415 for row Rn+6. In the redundant mode, the shift segment 415 for spare row Rn+12 is utilized rather than bypassed and data is shifted into each segment 415 from the segment 415 corresponding to the immediately preceding for rows Rn+8 to Rn+13. Thus, data that would have been loaded for rows Rn+7, Rn+8, Rn+9, Rn+10, and Rn+11 in normal mode is instead shifted down one row and is, in redundant mode, loaded for, respectively, rows Rn+8, Rn+9, Rn+10, Rn+11, and spare row Rn+12.

Figure 4C:
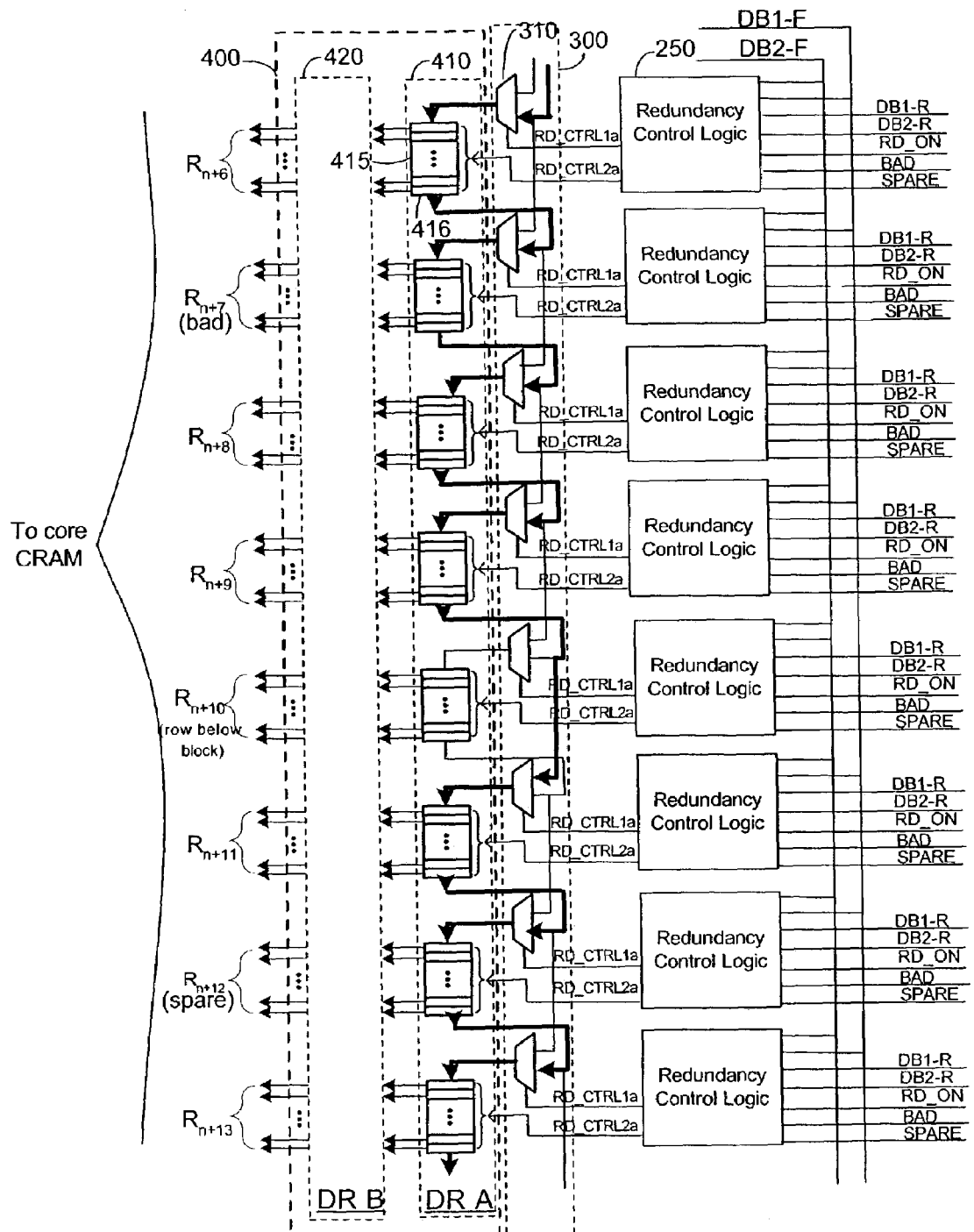

FIG. 4c illustrates data shifting in a redundant mode (row Rn+7 being bad) for dedicated block 150 frames. As illustrated by the bold arrows through shifting circuitry 300 and register DRA 410, muxes 310 are controlled in the redundant mode such that the shift segment 415 for row Rn+7 is not bypassed. Thus, in redundant mode, those rows illustrated in FIG. 4c corresponding to dedicated block 150, i.e. rows Rn+6, Rn+7, Rn+8, and Rn+9, receive, for those frames spanning dedicated block 150 frames, the same data in redundant mode that they would have received in normal mode. However, rows Rn+11 and Rn+12, by contrast, follow the redundant mode row shifting that is followed for repairable frames. The portion of row Rn+10 immediately below the dedicated block 150, is bypassed in redundant mode. Thus, the data that would have been provided to rows Rn+10 and Rn+11 in normal mode is instead provided to rows Rn+11 and Rn+12 in redundant mode. Thus, the frames for dedicated block 150 are at least partially repairable, i.e., row shifting occurs in the LAB region below dedicated block 150 and at and above spare row Rn+12.

Figure 4D:
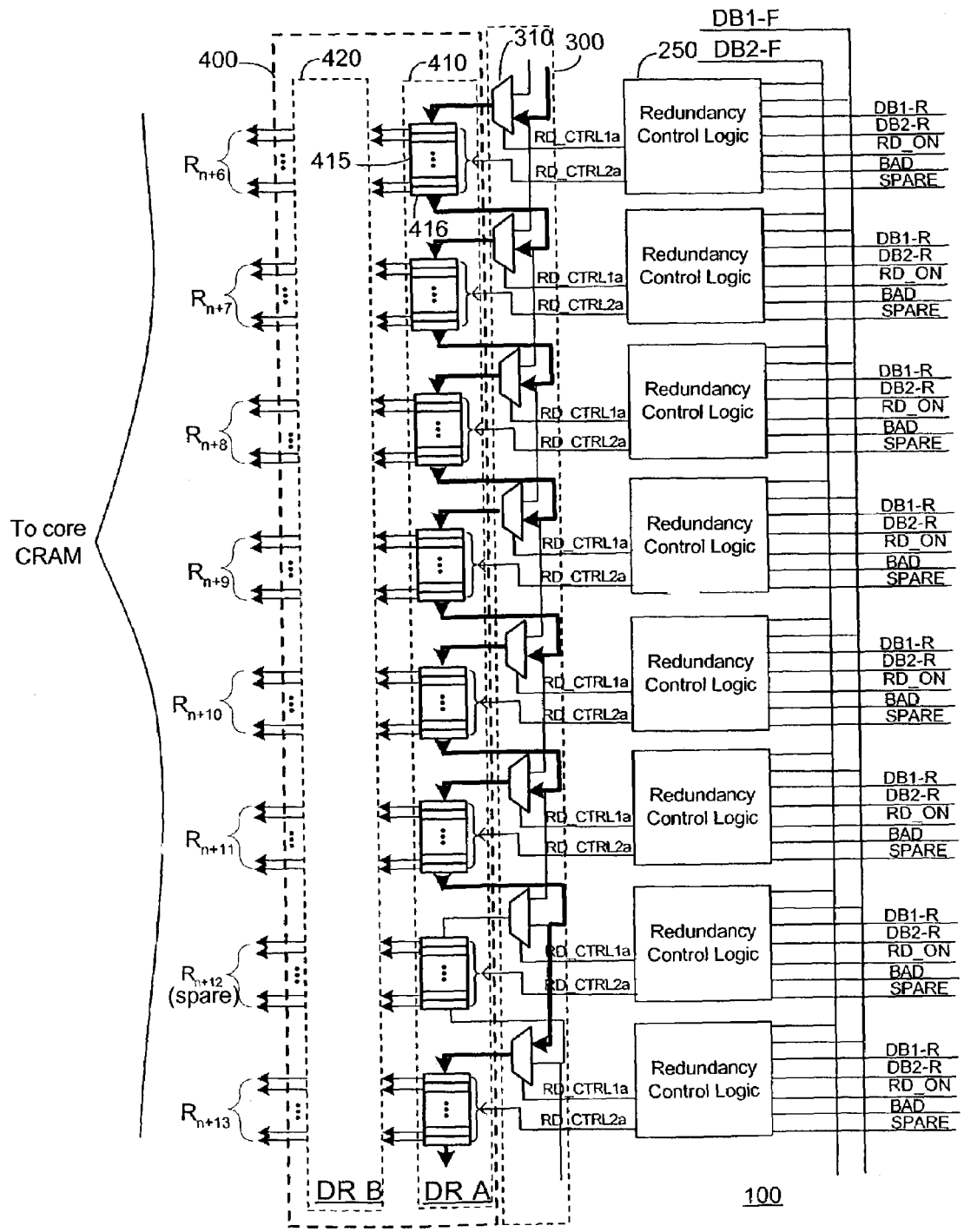

FIG. 4d illustrates data shifting in a redundant mode for the portion of rows Rn+6 to Rn+13 corresponding to dedicated block 160 frames. As illustrated by the bold arrows through shifting circuitry 300 and register DRA 410, for non-repairable frames, muxes 310 are controlled in both normal and redundant modes such that data is shifted into each segment 415 from the segment 415 corresponding to the immediately preceding row for all rows from row Rn+6 to row Rn+13, except row Rn+12. The shift segment 415 for spare row Rn+12 is bypassed for block 160 frames in both normal and redundant modes. Because block 160 is not being repaired by row shifting, and because spare row Rn+12 is immediately below dedicated block 160, there is no need to use the LABs in the portion of spare row Rn+12 directly below block 160.

Figure 5A:
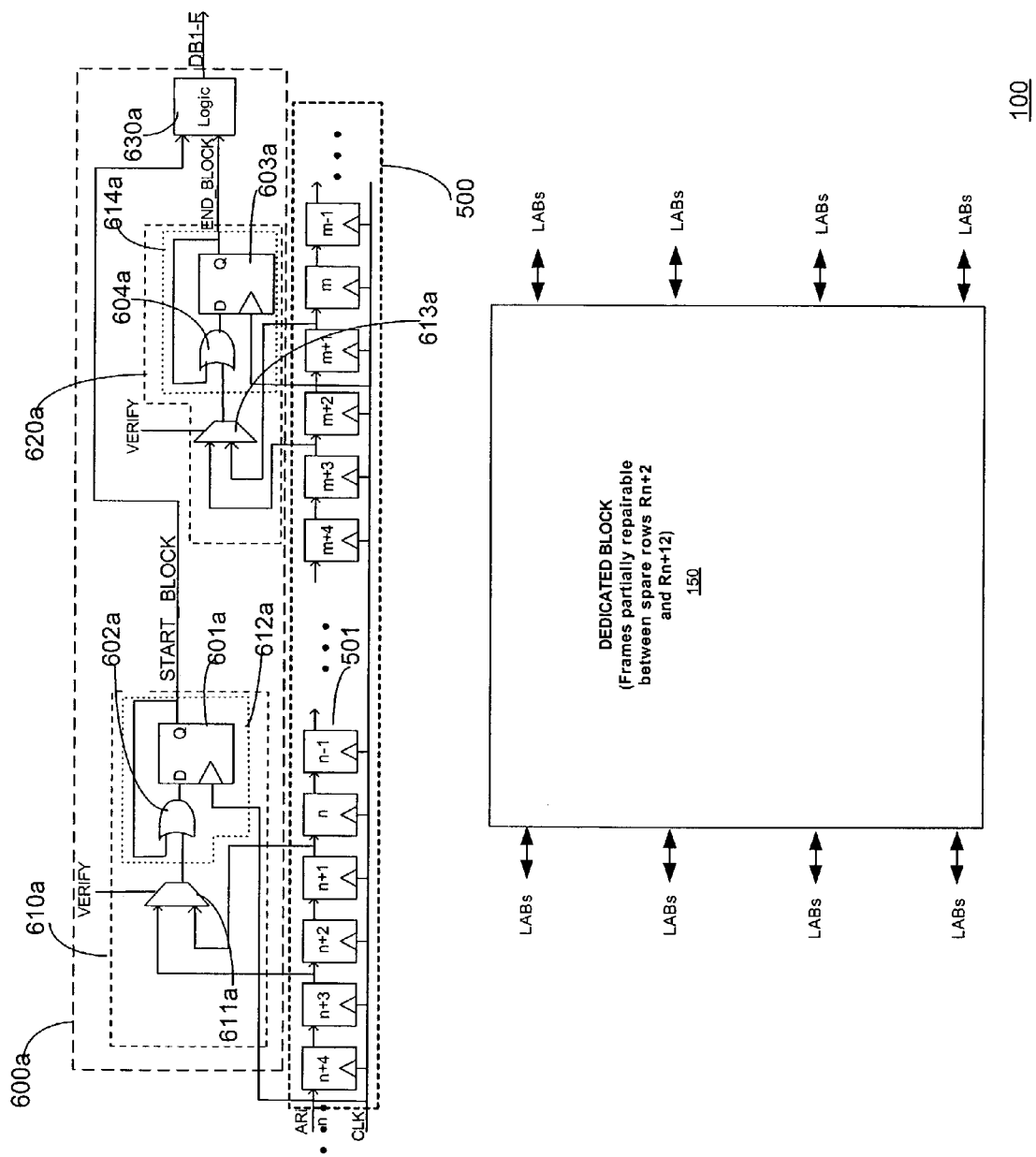
FIGS. 5a–5b show further details of the PLD illustrated in FIG. 1 and, in particular, illustrate detection circuitry coupled to an address register to detect frames at the beginning and end of dedicated blocks during either a programming sequence or a verification sequence.
Figure 5B:
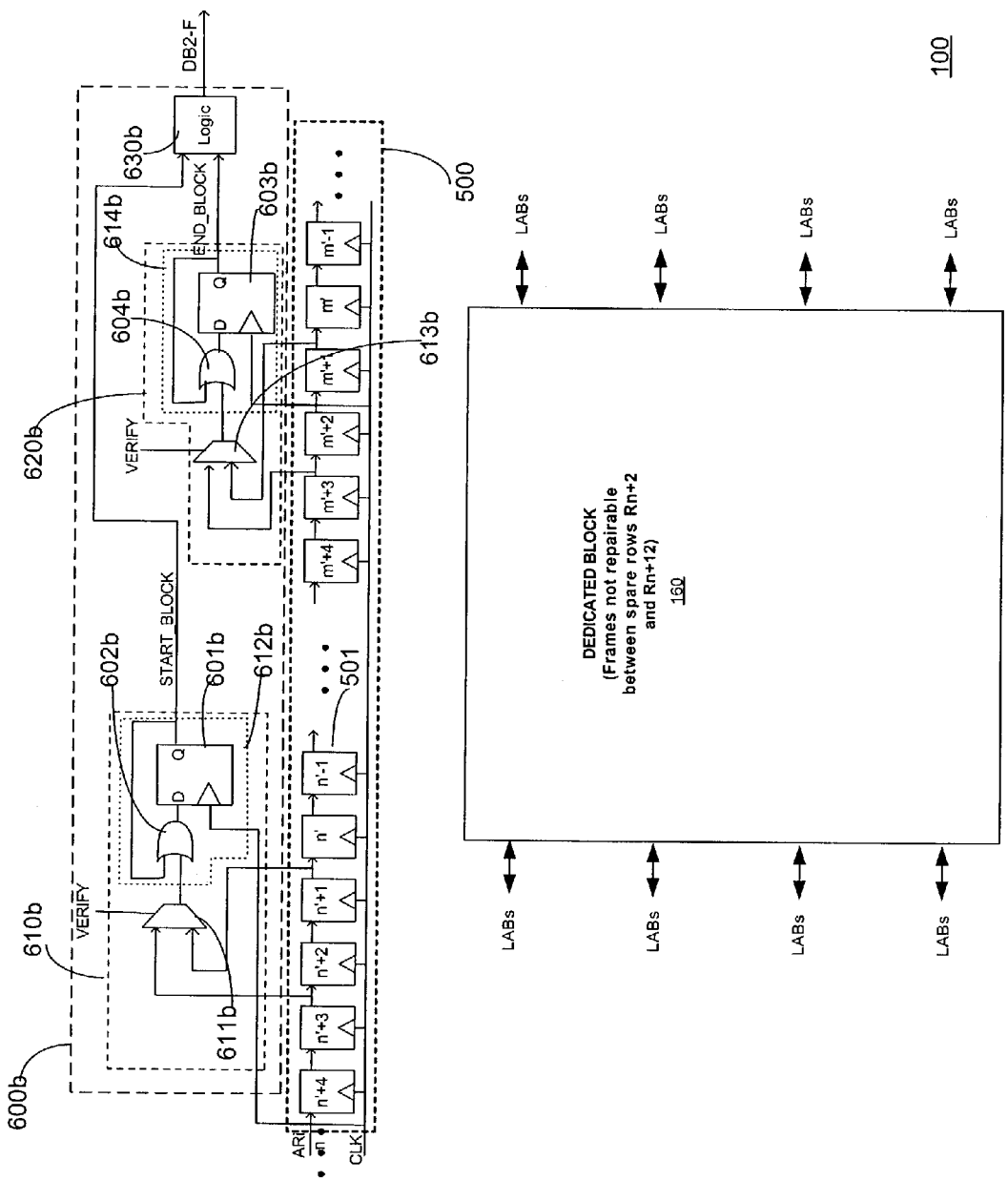

FIGS. 5a–5b show further details of the PLD 100 illustrated in FIG. 1 and, in particular, illustrates detection circuitry coupled to address register 500 to detect frames at the beginning and end of dedicated block 150 (FIG. 5a) and dedicated block 160 (FIG. 5b) during a programming or a verification sequence.

As illustrated in FIG. 5a, detector 600a includes a start detector 610a, an end detector 620a, and a logic circuit 630a. Start detector 610a includes a mux 611a and a register 612a. Register 612a includes a flip flop 601a and an OR gate 602a coupled as shown. End detector 620a includes a mux 613a and a register 614a. Register 614a includes a flip flop 603a and an OR gate 604a coupled as shown.

Address register 500 includes register elements 501, implemented as flip flops in this example. Each flip flop 501 is coupled to select one corresponding frame in the configuration grid (comprising configuration elements 101) of the portion of PLD 100 illustrated in FIG. 1 for receiving configuration data. I.e., in this particular example, the output of the flip flop is coupled to configuration elements for selectively opening a connection between a frame of data in the data register and a frame of configuration elements in the configuration grid. Flip flops 501 are coupled together as a shift register as shown. In a typical programming sequence, a high value or "1" is shifted from one flip flop to the next in order to assert frames one at a time for receiving programming data from data register 400. All other flips flops (for frames not being asserted) will output a "0" value.

Detector 600a is coupled to address register 500 to detect in advance when frames spanning dedicated block 150 will be asserted for programming. The flip flops 501 in the portion of address register 500 illustrated in FIG. 5a are numbered, from left to right, n+4, n+3, n+2, n+1, n, and n−1, corresponding with frames near the left edge of dedicated block 150, and, m+4, m+3, m+2, m+1, m, and m−1, corresponding with frames near the right edge of dedicated block 150. Specifically, the "n" flip flop 501 corresponds to the first frame including configuration elements for programming dedicated block 150 and the "m" flip flop 501 corresponds to the first frame after frames including configuration elements for programming dedicated block 150.

As illustrated in FIG. 5a, referring to start detector 610a, mux 611a is coupled as shown to select input received from the output of either the n+3 or the n+1 register element 501. Mux 611a is coupled as shown to provide the selected input to register 612a (at OR gate 602a as shown). Register 612a outputs a START_BLOCK signal as shown. Prior to receiving a high value from mux 611a, register 612a outputs a low value for signal START_BLOCK. Once a high value is first received by register 612a from mux 611a (indicating a frame to be programmed at the beginning of block 150), register 612a outputs a high value for signal START_BLOCK. That signal will remain high after the high value input to register 612a from mux 611a returns to a low value. Register 612a is coupled to provide the signal START_BLOCK to logic 630a as shown.

Similarly, referring to end detector 620a, mux 613a is coupled as shown to select input received from the output of either the m+3 or the m+1 register element 501. Mux 613a is coupled as shown to provide the selected input to register 614a (at OR gate 604a as shown). Register 614a outputs an END_BLOCK signal as shown. Prior to receiving a high value from mux 613a, register 614a outputs a low value for signal END_BLOCK. Once a high value is first received by register 614a from mux 613a (indicating a frame to be programmed at after the end of block 150), register 614a outputs a high value for signal END_BLOCK. That signal will remain high after the high value input to register 614a from mux 613a returns to a low value. Register 614a is coupled to provide the signal END_BLOCK to logic 630a as shown.

Continuing with FIG. 5a, Logic 630a, based upon the received signals START_BLOCK and END_BLOCK, outputs signal DB1-F (received by the redundancy logic circuits 250 illustrated in FIGS. 4a–4d). Logic circuit 630a implements logic indicated by the values in TABLE B:

TABLE B

| START_BLOCK value | END_BLOCK value | DB1-F value |
| --- | --- | --- |
| 0 | 0 | 0 (prior to programming of block 150 frames) |
| 1 | 0 | 1 (during programming of block 150 frames) |
| 1 | 1 | 0 (after programming of block 150 frames) |

Continuing with FIG. 5a, during standard programming, start detector mux 611a and end detector mux 613a are controlled to select input from registers 501 numbered, respectively, n+3 and m+3. This means that detector 600a identifies, respectively, the beginning and end of dedicated block 150 three clock cycles prior to the frames at the respective beginning and ending edges of dedicated block 150 actually being asserted for programming. How many clock cycles in advance the start and end of dedicated blocks need to be detected will depend on the particular design of a PLD in which an embodiment of the present invention is implemented. However, with respect to the example of PLD 100 illustrated herein, the need for advance detection in programming arises from considerations related to the programming sequence for configuring the device, the detection circuitry itself, and timing consideration related to the distance traveled by signal DB1-F.

These considerations may be explained as follows. With respect to the programming sequence, as previously described with reference to FIG. 1 and FIGS. 4a–4d, during configuration of the device data is first shifted into DRA 410, then parallel loaded into DRB 420, then a frame in the configuration grid is asserted to receive data from DRB 420. Address register 500, DRA 410, and DRB 420 are each clocked differently; however, for purposes of discussing the timing of programming events, "clock cycles" will be described relative to the clocking of address register 500. The relevant registers are clocked such that while data from DRB 420 is loaded into a frame of configuration elements 101 (referenced in FIG. 1), DRA 410 receives configuration data for the next frame to be configured. Thus, during regular programming, a frame of data is loaded into DRA 410 one clock cycle prior to the assertion of that frame in the configuration grid by address register 500. With respect to the detection circuitry 600a, registers 612a and 614a are clocked registers and thus add an extra clock cycle to the detection of, respectively, the start and end of block 150 frames (note that registers 612a and 614a are coupled as shown to be clocked by the same clock signal that clocks address register 500). Finally, with respect to timing issues related to the travel distance of signal DB1-F, in this particular implementation, it is advantageous to detect block 150 one clock cycle earlier. As illustrated and described below in the context of FIG. 6, a pipeline register is added to redundancy control logic circuits 250 so that signals DBF-1 and DBF-2 can be detected earlier and then provided more precisely at the time needed to other logic for generating signal RD_CTRL1a and RD_CTRL2a.

Thus, to summarize, during programming of the configuration grid in the present implementation, it is useful to detect frames at the start and end of a dedicated block three clock cycles prior to the actual assertion of those frames in the configuration grid by address register 500. A first clock cycle relates to the use of DRB 420 in conjunction with DRA 410 to load data, a second clock cycle relates to the presence of start and end detection clocked registers (respectively, 612a and 614a), and a third clock cycle relates to the presence of a pipeline register in redundancy control circuits 250 (see FIG. 6 and accompanying text) which allows further advance detection of dedicated blocks to ameliorate timing issues that may arise related to the distance traveled by signal DB1-F. Thus, during programming of PLD 100, the beginning of block 150 is detected upon assertion of the frame corresponding to the "n+3" address element 501, i.e., three cycles in advance of assertion of the frame corresponding to the "n" address element 501 at the beginning of dedicated block 150. Similarly, the end of dedicated block 150 is detected upon assertion of the frame corresponding to the "m+3" address element 501, i.e., three cycles in advance of assertion of the frame corresponding to the "m" address element 501 at the end of block 150.

However, in the context of verification of PLD 100, the sequence is altered relative to the programming sequence. In verification, data is read out of the core into data register 400 and then routed for verification. PLD 100 provides for verification either during testing or during an error detection feature which runs transparently during normal operation. If verification is occurring during testing, the data is routed to test output pins as shown and described in the context of FIGS. 7b, 7d, 7f, and 7h. If verification is occurring during user mode error detection, then data is routed to a control block for verification (control block not separately shown). In either case, during verification, the address register asserts a frame just prior rather than just after the data being loaded into DRA 410 (in verification, data is "loaded" into DRA 410 by being read out from the configuration grid rather than being loaded in from a programming data source such as a control block or test input pins). Therefore, during verification, detection of the start and end of dedicated block 150 needs to occur closer to (i.e. less in advance of) the actual assertion of frames at the edges of the dedicated block. In the particular implementation illustrated, in verification mode, start detector mux 611a, based on the signal VERIFY at the mux control input as shown, selects input from address element 501 numbered n+1 (instead of n+3 during programming). Similarly, end detector mux 613a, also based on the VERIFY signal as illustrated, selects input from address element 501 numbered m+1 (instead of m+3 as during programming). This selection allows redundancy control circuits 250 to, at the appropriate time, control switching of data flow during a verification sequence, either during user mode error detection or during testing (verification during testing is illustrated and described in the context of FIGS. 7b, 7d, 7f, and 7h).

Those skilled in the art will appreciate that, in implementations other than the implementation illustrated, it may be appropriate to couple detector circuitry such as detector 600a to an address register such as address register 400 at different address elements than those illustrated in the presently described embodiment. For example, depending on the programming sequence in programming or verification modes of a particular other PLD, a detector might be coupled to address elements comparable to those numbered herein "n" or even "n−1" to detect the beginning of a block at the appropriate time (and those numbered herein "m" or even "m−1" to detect the end of such a block). Whatever the particular implementation, one useful aspect of the presently illustrated embodiment is that muxes such as muxes 611a and 613a allow the timing of detection to be varied between programming and verification modes which helps accommodate differences between such modes. Those skilled in the art will further appreciate that circuits quite different than the particular detector circuit illustrated might be used to detect the beginning and end of dedicated blocks during a programming sequence. To cite but one example, a large OR gate might be coupled to address each register element corresponding to frames at or near frames that span a dedicated block. Such an OR gate might need to be quite large depending on the width of the dedicated block. Thus the illustrated detector is presently preferred relative to such an alternative. However, those skilled in the art will appreciate that many such alternatives may exist and may be implemented without necessarily departing from the spirit and scope of various aspects of the present invention.

FIG. 5b illustrates a detector 600b coupled to the portion of address register 500 in the vicinity of frames corresponding to dedicated block 160. The flip flops 501 in the portion of address register 500 illustrated in FIG. 5b are numbered, from left to right, n'+4, n'+3, n'+2, n'+1, n', and n'−1 corresponding with frames near the left edge of dedicated block 160, and, m'+4, m'+3, m'+2, m'+1, m', and m'−1 corresponding with frames near the right edge of dedicated block 160. Detector 600b includes start detector 610b, end detector 620b, and logic circuit 630b. Start detector 610b includes a mux 611b and a register 612b. Register 612b includes a flip flop 601b and an OR gate 602b coupled as shown. End detector 620b includes a mux 613b and a register 614b. Register 614b includes a flip flop 603b and an OR gate 604b coupled as shown.

Dedicated blocks such as dedicated block 150 and dedicated block 160 may have different widths and thus the detectors such as detector 600a and 600b may also span different widths between the beginning and end of a dedicated block to accommodate such differences. However, in other respects, the detector 600b operates in conjunction with the illustrated portion of address register to detect dedicated block 160 in the same manner that the circuitry illustrated and described in FIG. 5a operates. Thus, the discussion of this circuitry will not be repeated in further detail. The primary distinction is that detector 600b illustrated in FIG. 5b generates a signal DB2-F (whereas detector 600a illustrated in FIG. 5a generates a signal DB1-F). Generation of distinct frame detection signals, DB1-F for dedicated block 150 and DB2-F for dedicated block 160 allows redundancy control logic 250 to distinguish which dedicated block is presently being programmed during a programming sequence. This and other aspects of redundancy control logic 250 will now be described in further detail.

Figure 6:
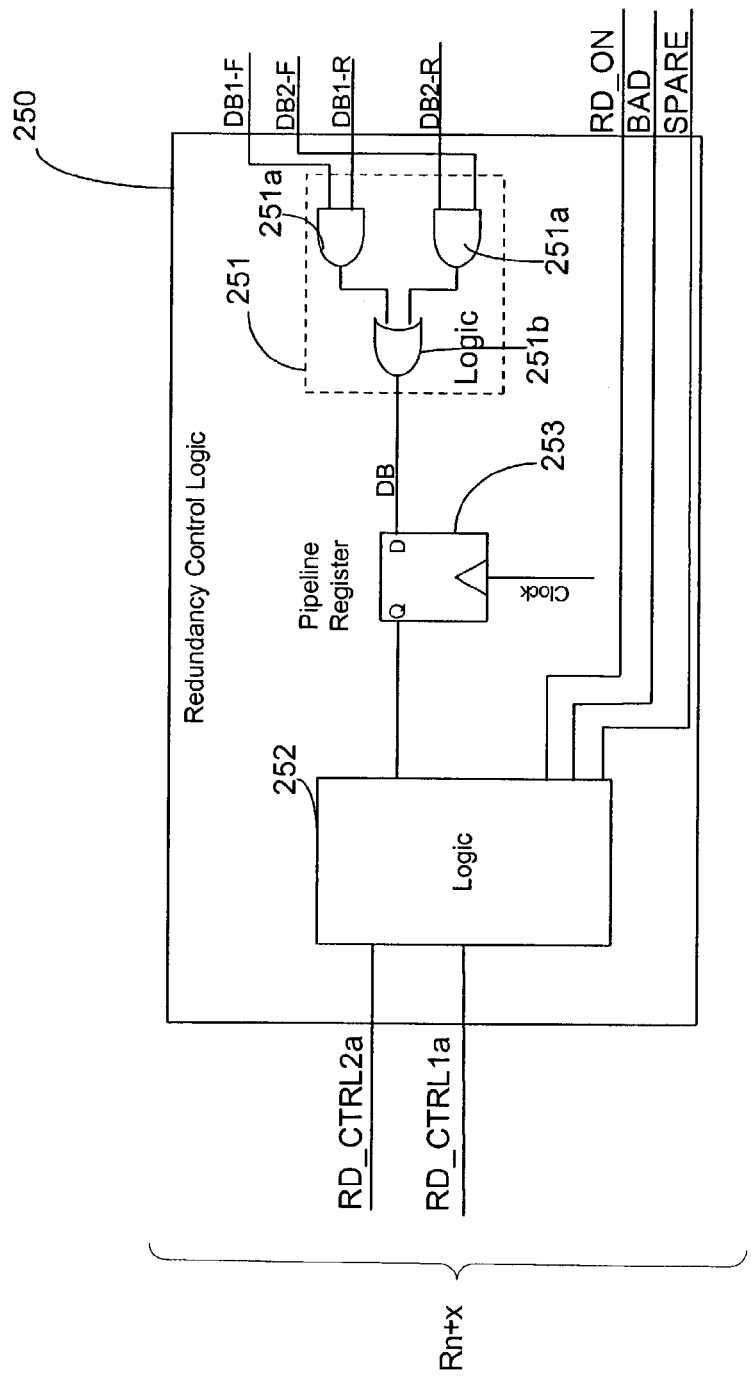
FIG. 6 illustrates, for an exemplary row, further details of the redundancy control logic shown in FIGS. 4a–4d.

FIG. 6 illustrates further details of redundancy control logic 250 (referenced in FIGS. 4a–4d and accompanying text) for an arbitrary row Rn+x. The illustrated elements of redundancy control logic 250 include first logic stage 251, pipeline register 253, and second logic stage 252. As illustrated, first logic stage 251 comprises AND gates 251a and OR gate 251b, coupled together as shown to receive signals DB1-F and DBF-2 (from, respectively, detectors 600a and detectors 600b of FIGS. 5a–5b) and signals DB1-R and DB2-R and to output signal DB. Thus, when either DB1-F and DB1-R are both high, or when DB2-F and DB2-R are both high, signal DB is high. Signal DB is provided to pipeline register 253 (implemented in this example as a flip flop) which is coupled to provide, upon clock toggling, signal DB to second stage logic 252. Second stage logic 252 is also coupled as shown to receive signals RD_ON, BAD, and SPARE. The meaning of these signals is indicated above in TABLE A. Signals RD_ON (indicating whether a redundant mode is engaged for a region including that row, e.g., whether the row is in a region at or below a bad row that is being repaired and at or above the closest spare row below the bad row), BAD (indicating whether the row needs repair and should be bypassed in the redundant mode), and SPARE (indicating that the row contains spare circuitry that may be used in the redundant mode), may be generated in a variety of ways. As one example, a PLD such as PLD 100 may have a fuse register that indicates rows for which redundancy needs to be engaged to effect repair, rows that are in need of repair, and spare rows. Although TABLE A indicates a particular meaning for each signal, these signals may be used in various contexts beyond the scope of the indicated meaning. For example, in normal mode, a BAD signal may be asserted for a spare row, not because the spare row is bad, but rather to signal a bypass of the spare row in normal mode. Various ways to implement logic for using signals similar to the exemplary signals will be apparent to those skill in the art.

Redundancy control logic 250 implements logic to provide signals RD_CTRL1a and RD_CTRL2a such that shifting of data into shift segments 415 of DRA 410 is consistent with the examples illustrated in FIGS. 4a–4d. Those skilled in the art will appreciate that a variety of particular logic circuits can implement redundancy control logic 250 to produce results consistent with the principles illustrated in FIGS. 4a–4d. The presence of pipeline register 252 allows pre-registering of signal DB. Signal DB indicates whether a dedicated block is being programmed by the portion of the frame to be loaded into DRA 410 corresponding to the row controlled by the particular redundancy control logic 250. This pre-registering of signal DB, as previously described, ameliorates timing issues that may arise due to the distance traveled by signals DB1-F and DB2-F from detector 600a or 600b. Those signals may be detected early, the results from first stage logic 251 pre-registered as signal DB at pipeline register 253, and, then, signal DB may be provided to second stage logic 252 when needed by toggling register 253's clock input.

The relationship between output signals RD_CTRL1a and RD_CTRL2a and signals DB, RD_ON, BAD, and SPARE is given by the following TABLE C. For ease of understanding, RD_CTRL1a and RD_CTRL2a will be characterized as indicating one of the following: (i) shift, (ii) no shift, (iii) bypass. The remaining signals will be indicated as either true ("1") or false ("0") (consistent with the meanings previously set forth in Table A):

TABLE C

| DB (=1 if dedicated block being programmed) | RD_ON | BAD | SPARE | RD_CTRL1a and RD_CTRL2a effect: | COMMENTS: |
|---|---|---|---|---|---|
| 0 | 0 | 0 | 0 | No shift | |
| 0 | 0 | 0 | 1 | Invalid case | RD_ON always 1 for spare row. In normal mode, spare row treated as BAD so BAD=1. In redundant mode, BAD=0 for spare row. |
| 0 | 0 | 1 | 0 | Invalid case | If BAD=1 then RD_ON=1 |
| 0 | 0 | 1 | 1 | Invalid case | If BAD=1 then RD_ON=1 |
| 0 | 1 | 0 | 0 | Shift | |
| 0 | 1 | 0 | 1 | Shift | |
| 0 | 1 | 1 | 0 | Bypass | |
| 0 | 1 | 1 | 1 | Bypass | |
| 1 | 0 | 0 | 0 | No shift | |
| 1 | 0 | 0 | 1 | Invalid case | RD_ON always 1 for spare row. In normal mode, spare row treated as BAD so BAD=1. In redundant mode, BAD=0 for spare row. |
| 1 | 0 | 1 | 0 | Invalid case | If BAD=1 then RD_ON=1 |
| 1 | 0 | 1 | 1 | Invalid case | If BAD=1 then RD_ON=1 |
| 1 | 1 | 0 | 0 | No shift | |
| 1 | 1 | 0 | 1 | Invalid case | In this particular example, the illustrated dedicated blocks do not span a spare row, so DB ≠ 1 for spare row. |
| 1 | 1 | 1 | 0 | No shift | |
| 1 | 1 | 1 | 1 | Invalid case | In this particular example, the illustrated dedicated blocks do not span a spare row, so DB ≠ 1 for spare row. |

FIGS. 7a–7h illustrate data switching during testing in normal mode (FIGS. 7a–7b) and in redundant mode for fully repairable frames (FIGS. 7c–7d), frames spanning dedicated block 150 (FIGS. 7d–7e), and frames spanning dedicated block 160 (FIGS. 7f–7h) for rows Rn+6 to Rn+13 of the portion of PLD 100 of FIG. 1.

Figure 7A:
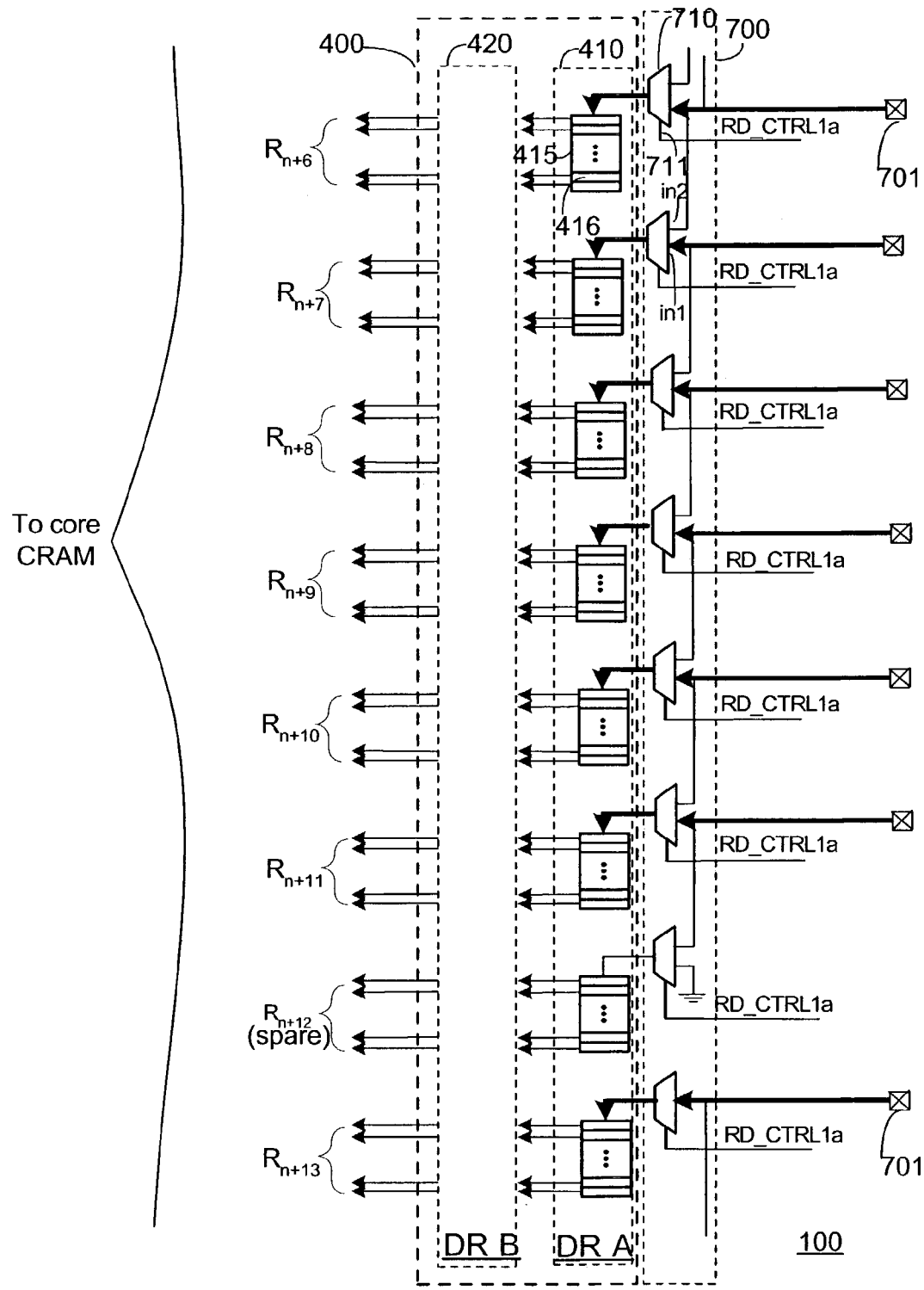
FIGS. 7a–7h illustrate data switching during testing in normal mode and in redundant mode for fully repairable frames and frames spanning dedicated block blocks for exemplary rows of the PLD of FIG. 1.

Referring to FIG. 7a, during test programming, data is loaded into DRA 410's shift segments 415 through multiple test input pins 701. Input switching circuitry 700 comprising muxes 710 is coupled to receive data from input pins 701 and provide it to shift segments 415 as shown. As illustrated, although there is a shift segment 415 for each row including spare row Rn+12, there are no test pins corresponding to spare row Rn+12. The reason for this is to render it transparent to a user whether or not the device, or a region of the device, is repaired through row shifting in a redundant mode. In other words, a user can use the same I/O pins whether or not redundancy is engaged. Thus, a pin is not shown corresponding to spare row Rn+12.

Figure 7B:
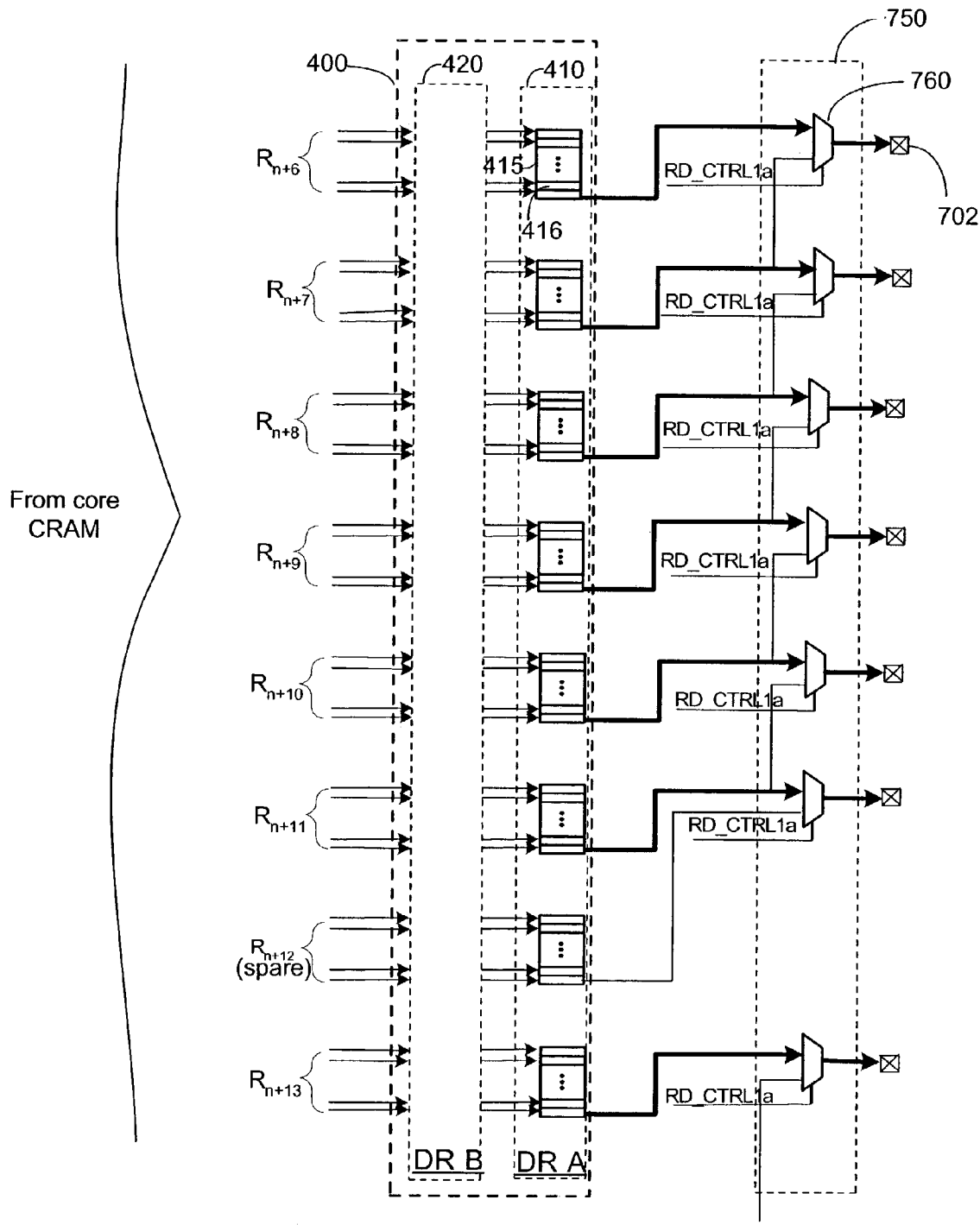

Referring to FIG. 7b, during test verification, data is read out through DRA 410's shift segments 415 through multiple test output pins 702. Output switching circuitry 750 comprising muxes 760 is coupled to receive data from shift segments 415 and provide it to output pins 702 as shown.

FIGS. 7a–7b illustrate data switching for testing in a normal (i.e. non-redundant mode). Muxes 710 and 760 have control inputs coupled to receive a redundancy control signal RD_CTRL1a as shown. Shift segments 415 are also coupled to receive signal RD_CTRL2a for clearing to implement row bypass, however that coupling is not shown in FIGS. 7a–7h to avoid overcomplicating the drawings. In non-redundant test mode, muxes 710 are controlled to switch data from pins 701 to shift segments 415 during test programming as indicated by the bold arrows in FIG. 7a and muxes 760 are controlled to switch data from shift segments 415 to pins 702 during test verification as indicated by the bold arrows in FIG. 7b.

Figure 7C:
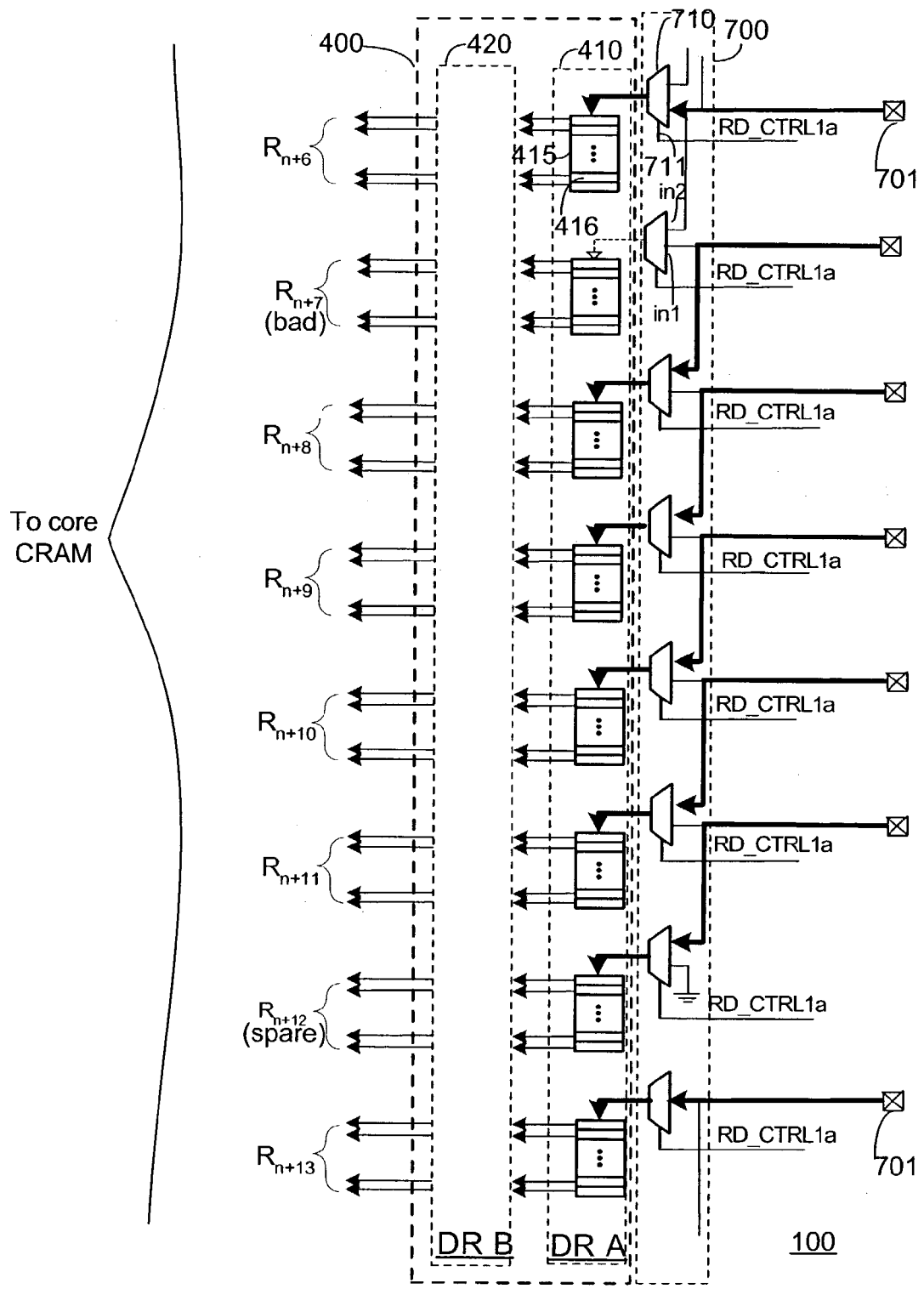
Figure 7D:
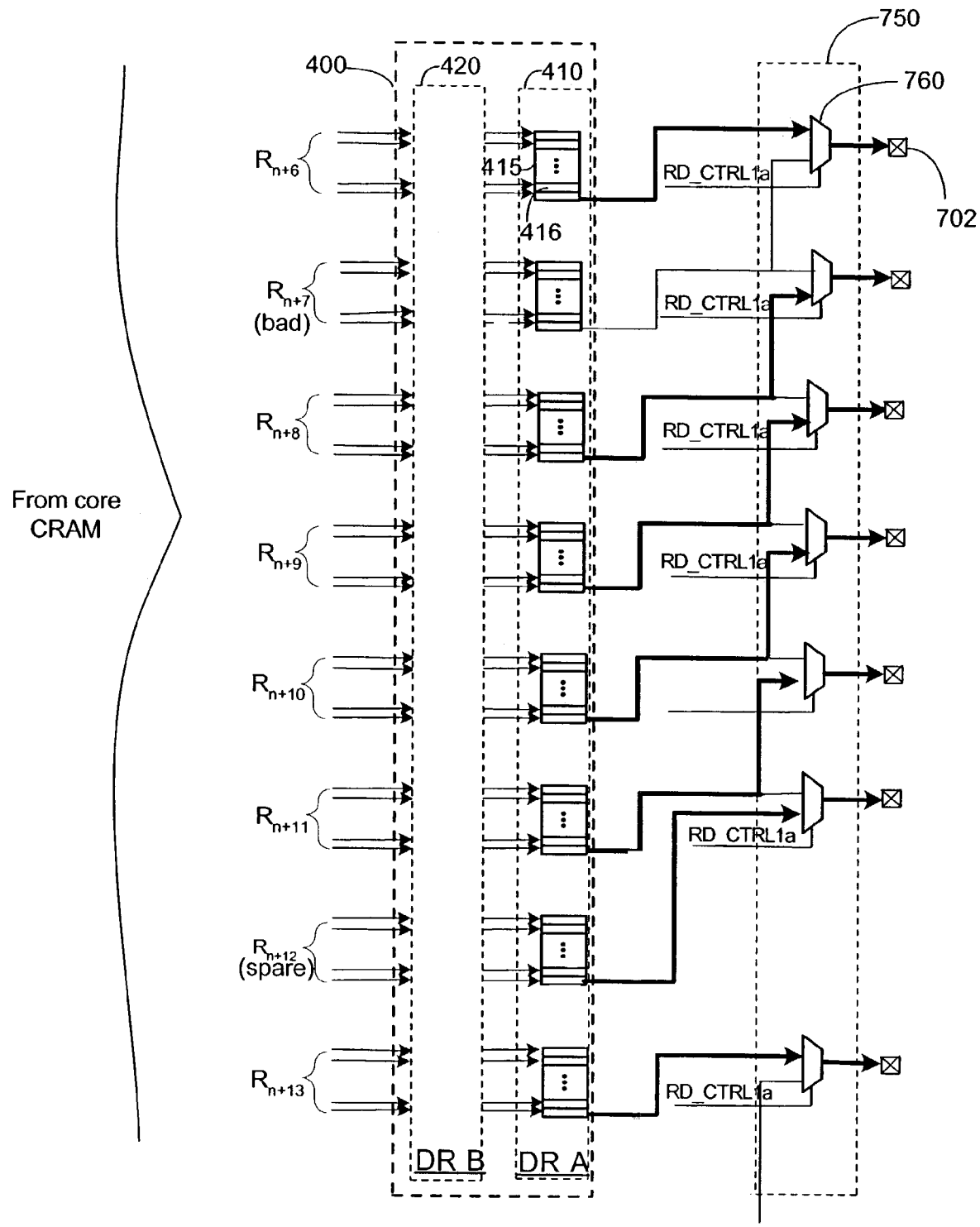

FIGS. 7c–7d illustrate data switching for testing in a redundant mode for fully repairable frames in which row Rn+7 is bad. For fully repairable frames, muxes 710 are controlled to switch data from pins 701 to shift segments 415 during test programming as indicated by the bold arrows in FIG. 7c and muxes 760 are controlled to switch data from shift segments 415 to pins 702 during test verification as indicated by the bold arrows in FIG. 7d. As indicated in FIG. 7c, during test programming, data is received at the input pin 701 corresponding to bad row Rn+7, however, data received through the row Rn+7 input pin 701 is switched by muxes 710 and input to the shift segment 415 corresponding to row Rn+8. As indicated in FIG. 7d, during verification, data read out through the row Rn+8 shift segment 415 is switched by muxes 760 to be output through the pin 702 corresponding to row Rn+7. Similarly, as shown in FIG. 7c, data input through pins 701 corresponding to rows Rn+8, Rn+9, Rn+10, and Rn+11 is switched by muxes 710 and input to shift segments 415 corresponding to, respectively, rows Rn+9, Rn+10, Rn+11, and spare row Rn+12. As shown in FIG. 7d, data read out through segments 415 corresponding to, respectively, rows Rn+9, Rn+10, Rn+11, and spare row Rn+12 is then switched to the output pins 702 corresponding to, respectively, rows Rn+8, Rn+9, Rn+10, and Rn+11. In this manner, test data is input and output through the same pins whether or not redundant row shifting is engaged.

Figure 7E:
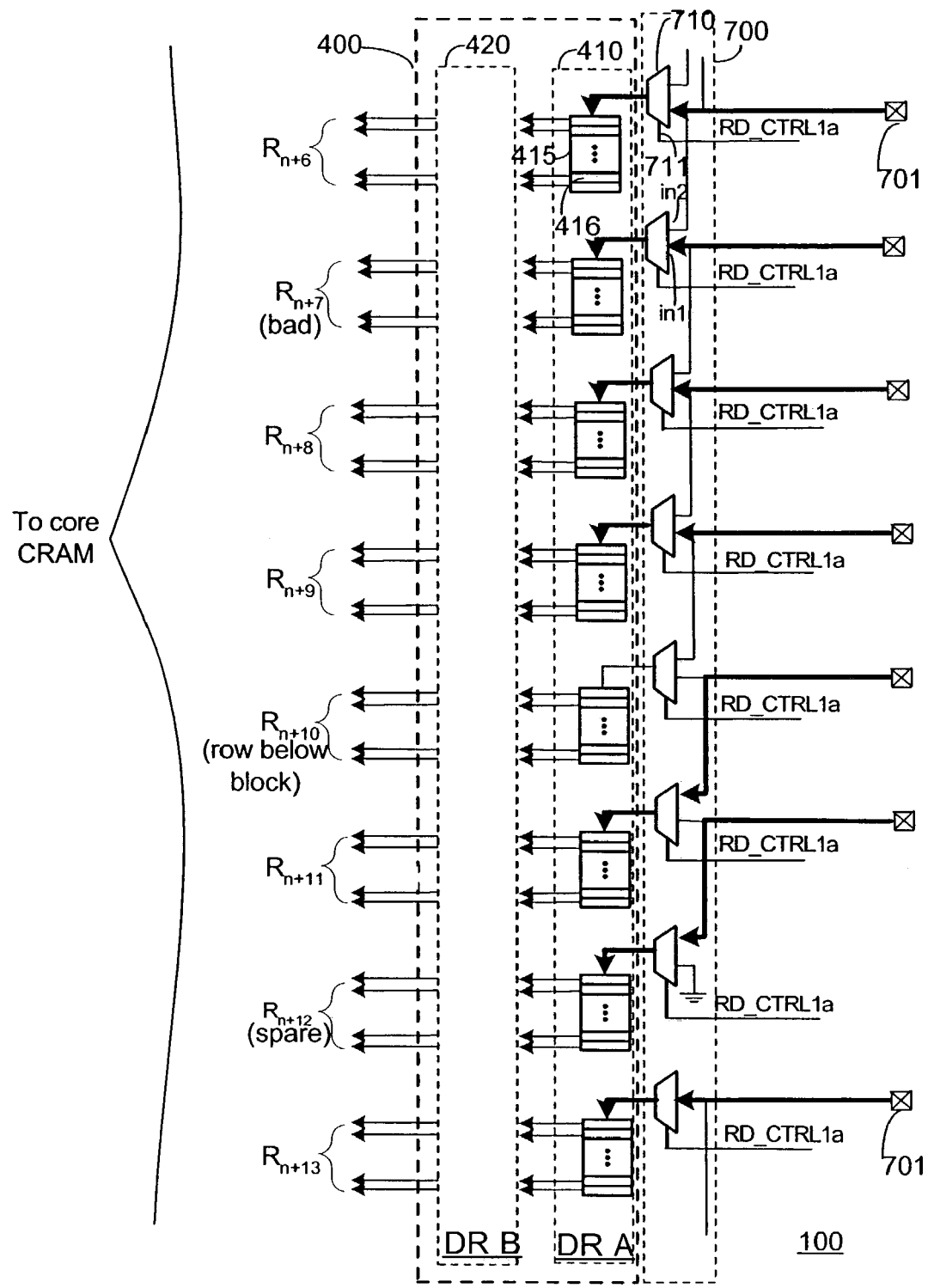
Figure 7F:
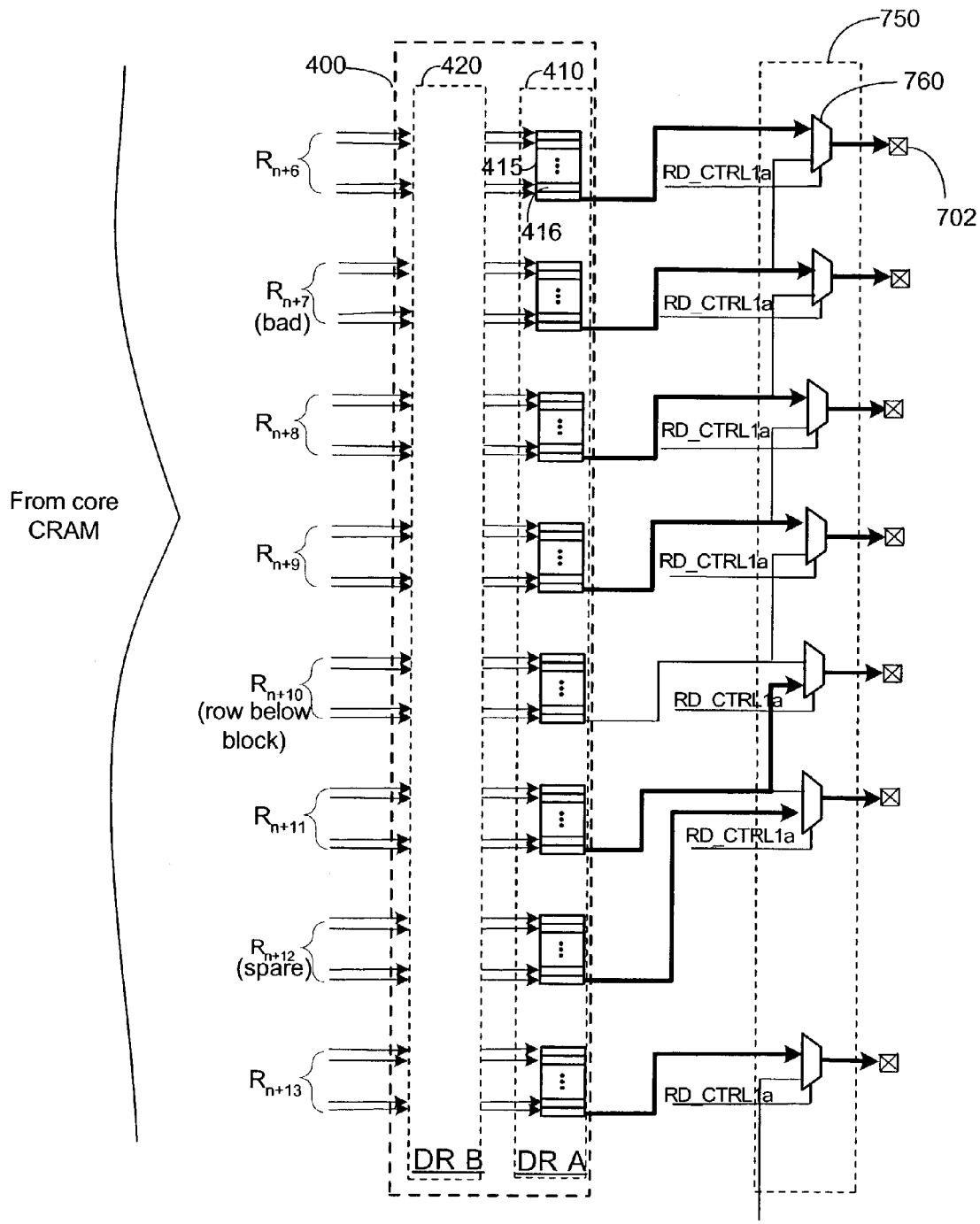

FIGS. 7e–7f illustrate data switching for testing in a redundant mode for block 150 frames. For block 150 frames (partially repairable between spare rows Rn+1 and Rn+12), muxes 710 are controlled to switch data from pins 701 to shift segments 415 during test programming as indicated by the bold arrows in FIG. 7e and muxes 760 are controlled to switch data from shift segments 415 to pins 702 during test verification as indicated by the bold arrows in FIG. 7f. Although row Rn+7 is considered bad in the logic array outside the dedicated block, row shifting does not occur within the dedicated block. Thus, as indicated in FIG. 7e, for rows Rn+6, Rn+7, Rn+8, and Rn+9, data is switched from the input pin 701, to the shift segment 415 corresponding to each of those rows during test programming. Similarly, as indicated in FIG. 7f, data read out through the shift segment 415 for rows Rn+6, Rn+7, Rn+8, and Rn+9 is switched to the output pin 702 corresponding to the same rows during test verification. However, row shifting does take place beginning just below dedicated block 150. As indicated in FIG. 7e, data received through the row Rn+10 input pin 701 is switched by muxes 710 and input into the shift segment 415 corresponding to row Rn+11. As indicated in FIG. 7f, data shifted through the row Rn+11 shift segment 415 is then switched by muxes 760 to be output through the pin 702 corresponding to row Rn+10 (thus, in this mode, the row Rn+10 shift segment 415, just below block 150, is bypassed for block 150 frames). Similarly, data input through pin 701 corresponding to row Rn+11 is switched by muxes 710 and input into the shift segment 415 corresponding to spare row Rn+12 as indicated in FIG. 7e. Data output from that row Rn+12 shift segment 415 is switched to the output pin 702 corresponding to row Rn+11 as indicated in FIG. 7f. In this manner, test data is input and output through the same pins in both normal and redundant modes whether or not row redundant shifting is effected for particular rows.

Figure 7G:
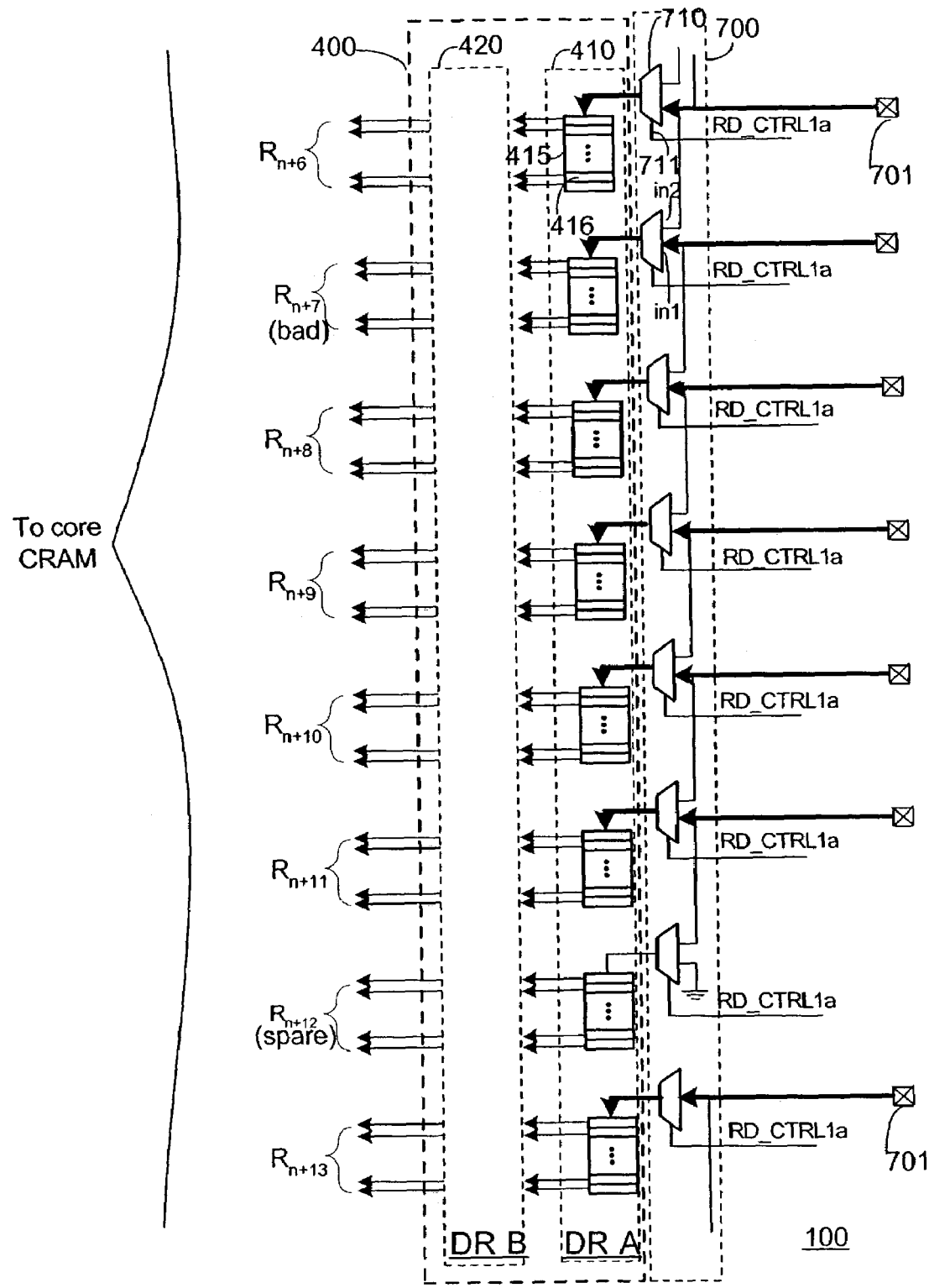
Figure 7H:
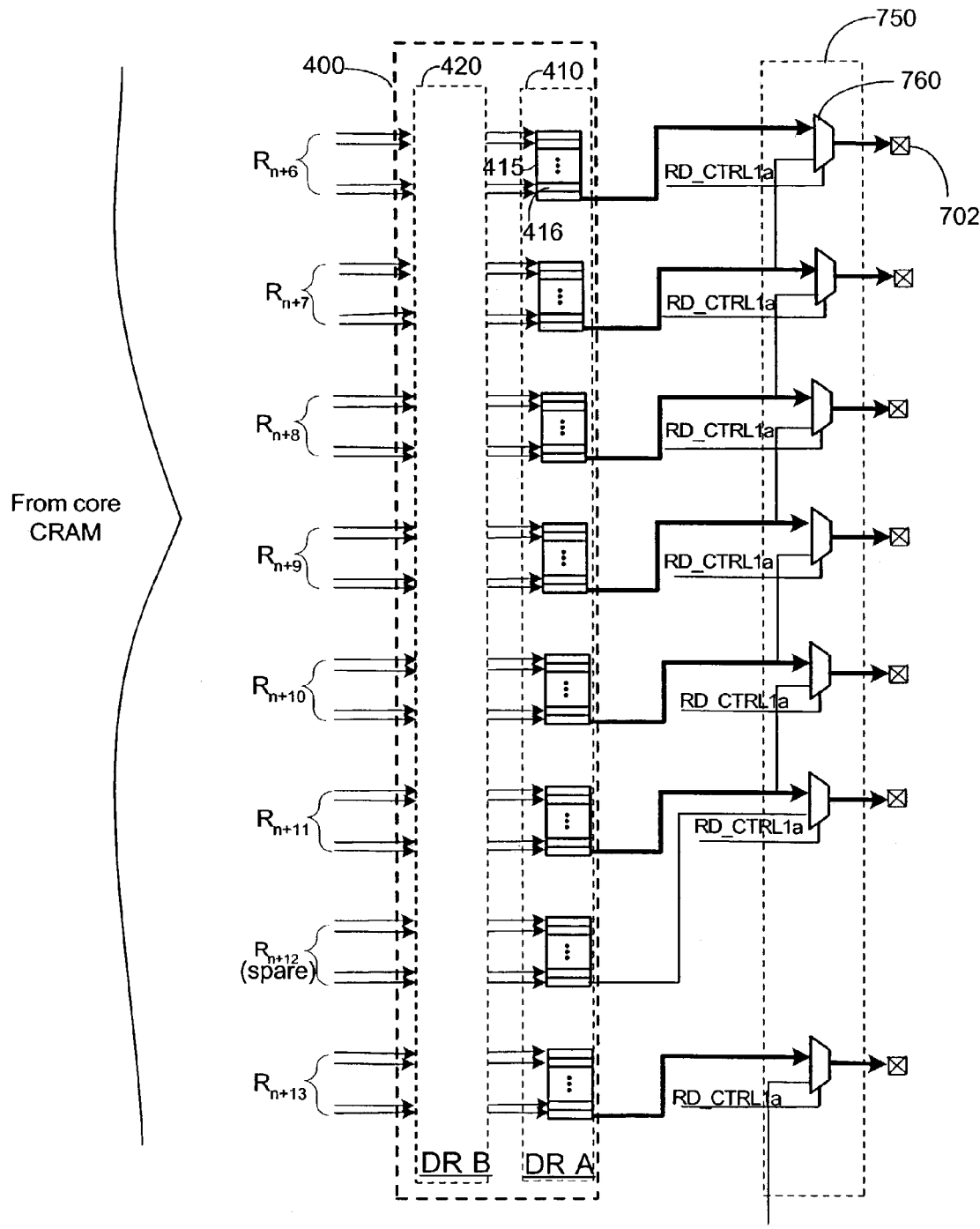

FIGS. 7g–7h illustrate data switching for testing in a redundant mode for block 160 frames. For block 160 frames (non-repairable between spare rows Rn+1 and Rn+12), muxes 710 are controlled to switch data from pins 701 to shift segments 415 during test programming as indicated by the bold arrows in FIG. 7g and muxes 760 are controlled to switch data from shift segments 415 to pins 702 during test verification as indicated by the bold arrows in FIG. 7h. Although row Rn+7 is considered bad in the logic array outside the dedicated block, row shifting does not occur within the dedicated block. Thus, as indicated in FIG. 7g, for rows Rn+6, Rn+7, Rn+8, Rn+9, Rn+10 and Rn+11, data is switched from the input pin 701, to the shift segment 415 corresponding to each of those rows during test programming. Similarly, as indicated in FIG. 7h, data read out through the shift segment 415 for rows Rn+6, Rn+7, Rn+8, Rn+9, Rn+10 and Rn+11 is switched to the output pin 702 corresponding to the same rows during test verification. Although redundancy is engaged, the portion of spare row Rn+12 just below dedicated block 160 is not used because no rows in dedicated block 160 are being repaired. Thus, as illustrated, the shift register segment 415 for spare row Rn+12 is not utilized for block 160 frames.

With reference to FIGS. 7a–7h, pins 701 and 702 are used not just during testing, but are also used during normal operation to exchange data with PLD 100. The row shifting illustrated in FIGS. 7a–7h to render redundancy row shifting transparent to the user is the same for I/O routing from and to pins 701 and 702 in user mode operation as it is for the illustrated test mode. Thus muxes 710 and 760 serve as part of redundancy I/O routing circuitry during user mode operation. The manner in which a captured instance of signal is registered during programming and then used in user mode for I/O routing will now be described in further detail.

Figure 8:
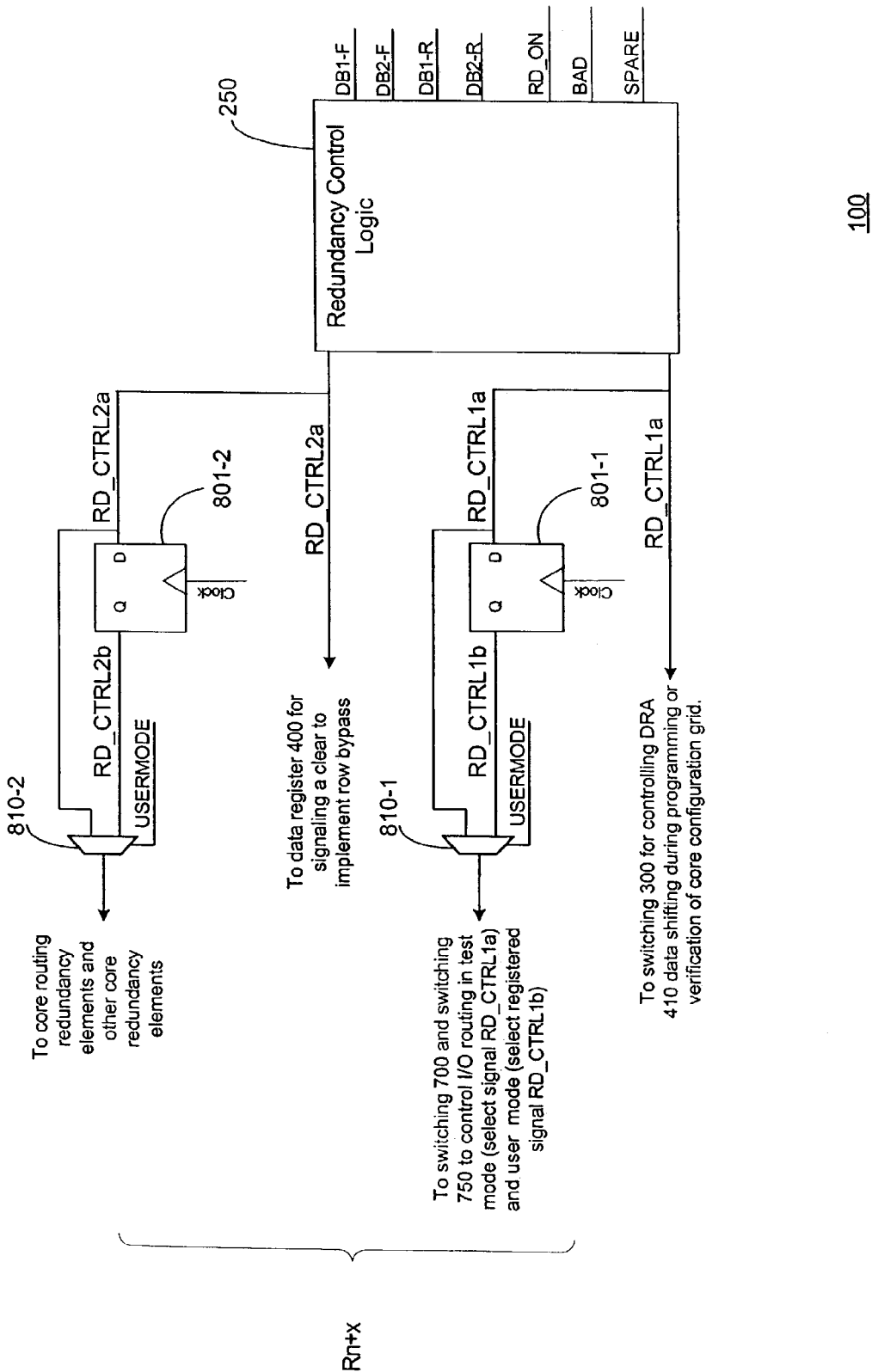
FIG. 8 illustrates further details of a control circuit including the redundancy control logic of FIG. 6 and also including additional circuitry for generating redundancy control signals for an exemplary row of the PLD of FIG. 1. In particular.

FIG. 8 illustrates further details of circuitry for generating redundancy control signals for an arbitrary row Rn+x of the PLD 100 of FIG. 1. In particular, FIG. 8 illustrates aspects of register and mux circuitry that allow redundancy routing elements to reuse signals generated for regular and test programming while being shielded during a user mode from signal toggling associated with an error detection feature.

As previously described in the context of FIGS. 4a–4d, during programming, signal RD_CTRL1a is used to control switching circuitry 300 for shifting data between shift segments 415 of DRA 410 and RD_CTRL2a is used to selectively clear a shift segment 415 corresponding to a row to be bypassed (e.g. a spare row in normal mode, a bad row in redundant mode). These signals are also used to control switching circuitry 300 and shift segments 415 in a similar manner during an error detection sequence that runs in a user mode (e.g. a mode in which the programmed PLD is utilized). During error detection, data is read out from core CRAM elements and routed to a control block to verify that the bits have not flipped.

Signals RD_CTRL1a and RD_CTRL2a are also potentially useful to control redundancy routing and other redundancy elements during user mode. For example, RD_CTRL2a is potentially usable to indicate row bypass, and thus can signal core routing elements that a row is to be bypassed when redundancy is engaged. Also, RD_CTRL1a is potentially usable to control switching data of data routed from and to I/O pins during user mode operation, and, in alternative embodiments, is also potentially usable to signal row shifting for core routing. However, for such user mode core and I/O signaling purposes, it is generally desirable for these signals to remain fixed. Because of the presence of dedicated blocks which do not follow the same redundancy patterns as do the rest of the logic array, these signals—when used for programming or verification—toggle depending on whether the data being loaded (or read out) is for a dedicated block (that does not shift rows during redundancy) or a logic array region (that does shift rows during redundancy). This toggling presents a problem for using the same signals in user mode to control both verification/programming for error detection on the one hand and core and I/O routing and other redundancy elements on the other.

As illustrated in FIG. 8, a solution to this problem involves capturing a value of signals 1a and 2a during programming and then using that value for signaling during user mode. As illustrated, redundancy control logic 250 for arbitrary row Rn+x is part of a larger control circuit 200 for row Rn+x. Control circuit 200 includes redundancy control logic circuit 250, registers 801-1 and 801-2, muxes 810-1 and 810-2, all coupled as shown and coupled to various circuitry of PLD 100 as indicated. Specifically, redundancy control logic 250 is coupled to provide signal RD_CTRL1a to programming switching circuitry 300, to register 801-1, and to an input of mux 810-1. Register 801-1 is coupled to provide signal RD_CTRL1b to another input of mux 810-1. Signal RD_CTRL1b is a registered value of signal RD_CTRL1a. When register 801-1's clock input is toggled, the present value of signal RD_CTRL1a will be registered and can be provided as signal RD_CTRL1b when needed. In the present example, the clock input to register 801-1 is toggled at the end of a programming sequence to capture that value for use in user mode. However, in an alternative example, a signal might be captured at some point during the programming sequence. In the present example, it is assumed that the last frame programmed is in a fully repairable region of the logic array.

The output of mux 810-1 is coupled to control switching circuitry 700 and 750. During test or non-test programming (and during test verification), the USERMODE signal shown at the control input to mux 810-1 is low and mux 810-1 selects signal RD_CTRL1a to control switching circuitry 700 and 750. However, during user mode operation, the USERMODE signal is high and mux 810-1 selects registered signal RD_CTRL1b to control switching circuitry 700 and 750 (which functions as part of I/O routing circuitry). In this manner, signal RD_CTRL1a can still be used to control switching 300 for controlling DRA 410 data shifting during verification in user mode error detection while signal RD_CTRL1b is provided as a fixed user mode signal to switching circuitry 700 and 750.

Continuing with the description of FIG. 8, redundancy control logic 250 is further coupled to provide signal RD_CTRL2a to data register 400, to register 801-2, and to an input of mux 810-2. Register 801-2 is coupled to provide signal RD_CTRL2b to another input of mux 810-2. Signal RD_CTRL2b is a registered value of signal RD_CTRL2a. When register 801-1's clock input is toggled, the present value of signal RD_CTRL2a will be registered and can be provided as signal RD_CTRL2b when needed.

The output of mux 810-2 is coupled to control core routing redundancy elements (e.g. muxes, drivers, and/or pass gates used to select rows to be driven or bypassed, or selection elements for routing between vertically adjacent LABs used for carry chain functions). During test or non-test programming (and during test verification), the USERMODE signal shown at the control input to mux 810-2 is low and mux 810-1 selects signal RD_CTRL2a. In the present example, that selection is irrelevant because during programming (or during test verification), the signal output by mux 810-2 is not utilized by the core, thus whether or not the signal is toggling does not matter. Thus, an alternative to the present example may replace mux 810-2 with a tri-state driver that receives signal RD_CTRL2b but not signal RD_CTRL2a. However use of mux 810-2 allows the option of providing signal RD_CTRL2a to the core should that be useful in other contexts. By contrast, during user mode operation, the USERMODE signal is high and mux 810-2 selects registered signal RD_CTRL2b to control core redundancy elements. In this manner, signal RD_CTRL2a can still be used to control selective clearing of DRA 410's shift segments 415 during verification in user mode error detection while signal RD_CTRL2b is provided as a fixed user mode signal to control core redundancy elements.

FIGS. 9a–9d show routing interfaces to and from dedicated block 150 including circuitry to switch signals in normal and redundant modes between the dedicated block and a surrounding logic array. Only the portions corresponding to rows Rn+6 to Rn+13 of the portion of PLD 100 of FIG. 1 are shown.

When the programmed PLD is operated in a user mode (either a normal mode or redundant mode), signals flow throughout the core including dedicated blocks such as dedicated blocks 150 and 160. In a redundant mode, row shifting occurs in the logic array regions outside of the dedicated blocks, but not in the block themselves. Therefore, additional circuitry is needed at the logic row interfaces to the dedicated blocks so that the portion of the dedicated block that interfaces to a first row in normal mode interface to a second row during redundant mode. In the drawings, routing interfaces for dedicated block 150 are shown for purposes of illustration. Those skilled in the art will appreciate that the same principles for routing to and from dedicated block 150 in normal and redundant modes apply to routing to a from dedicated block 160, and thus such routing and associated circuitry is not separately shown for dedicated block 160.

Figure 9A:
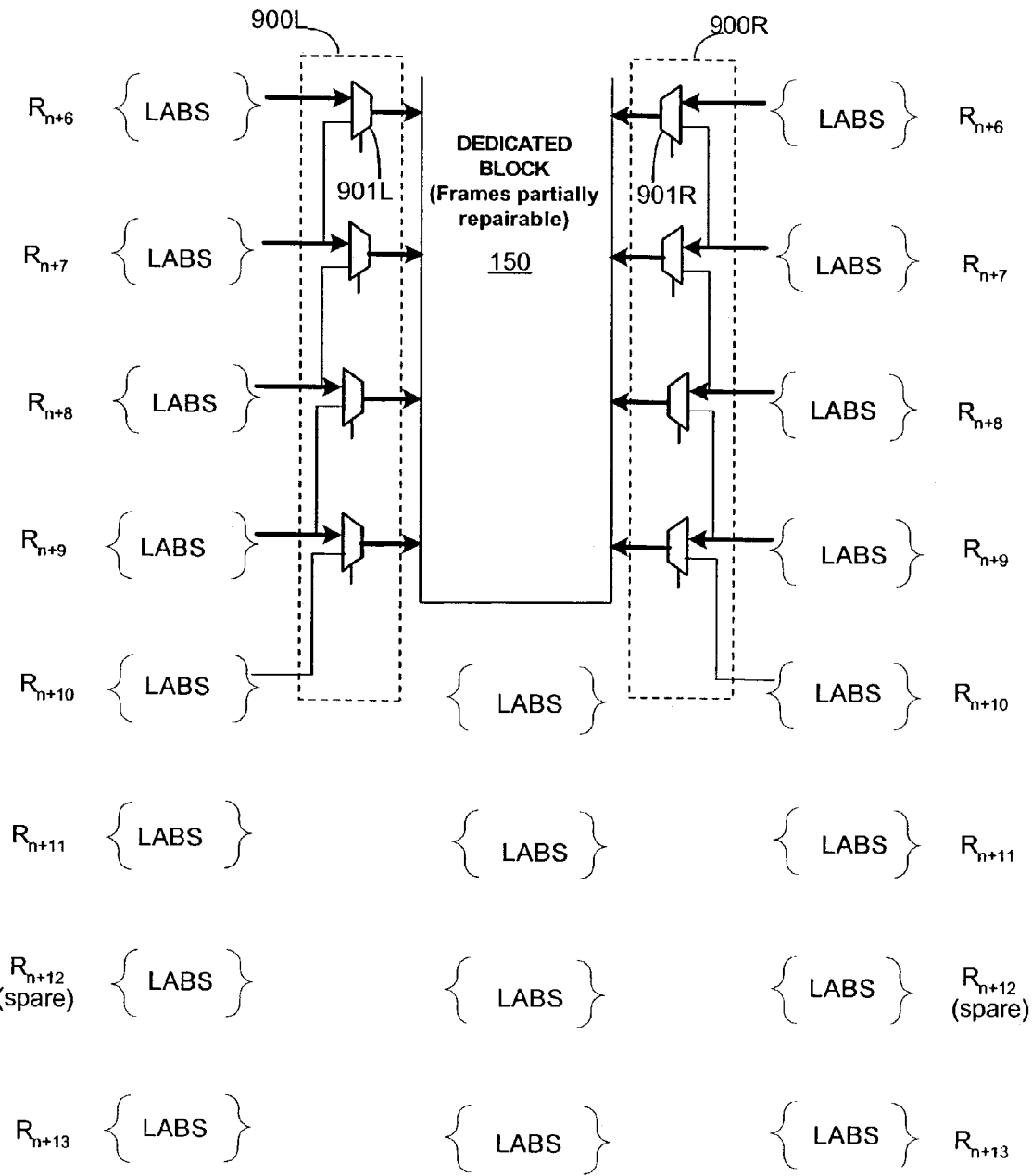
FIGS. 9a–9d illustrate switching circuitry to provide normal and redundant mode interface routing between a dedicated block and a logic array for exemplary rows of the PLD of FIG. 1.

Referring to FIG. 9a, dedicated block 150 is coupled to both a left input interface 900L and a right input interface 900R, comprising, respectively, muxes 901L and 901R as shown. In a normal mode, muxes 901L and 901R are controlled to route signals straight into block 150 at portions of the block corresponding to proximate rows as indicated by the bold arrows.

Figure 9B:
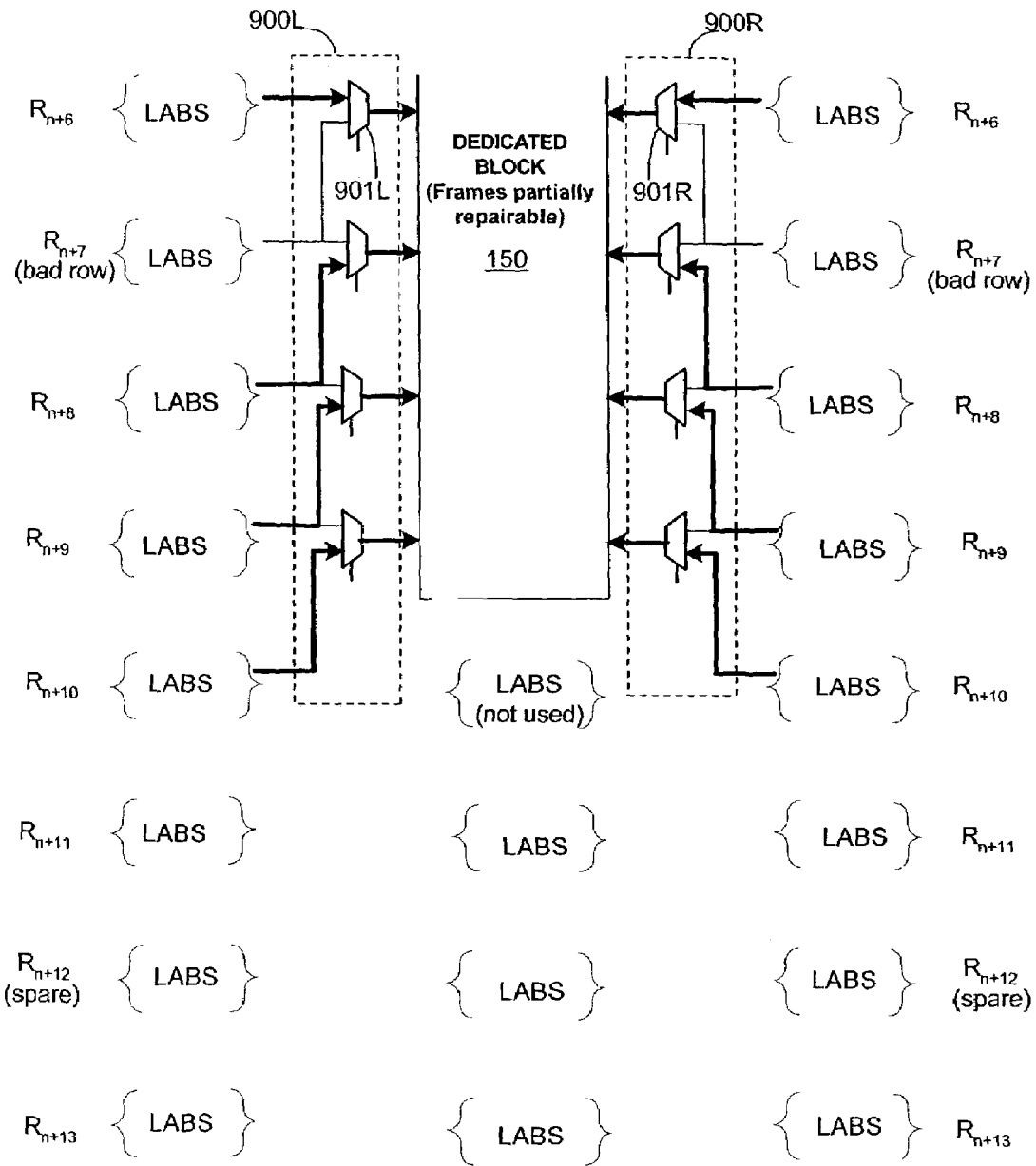

Referring to FIG. 9b, in a redundant mode, muxes 901L and 901R corresponding to rows Rn+7 to Rn+9 are controlled to route signals into the same portions of block 150, but from the next rows below (i.e. respectively, rows Rn+8 to Rn+10) as indicated by the bold arrows.

Figure 9C:
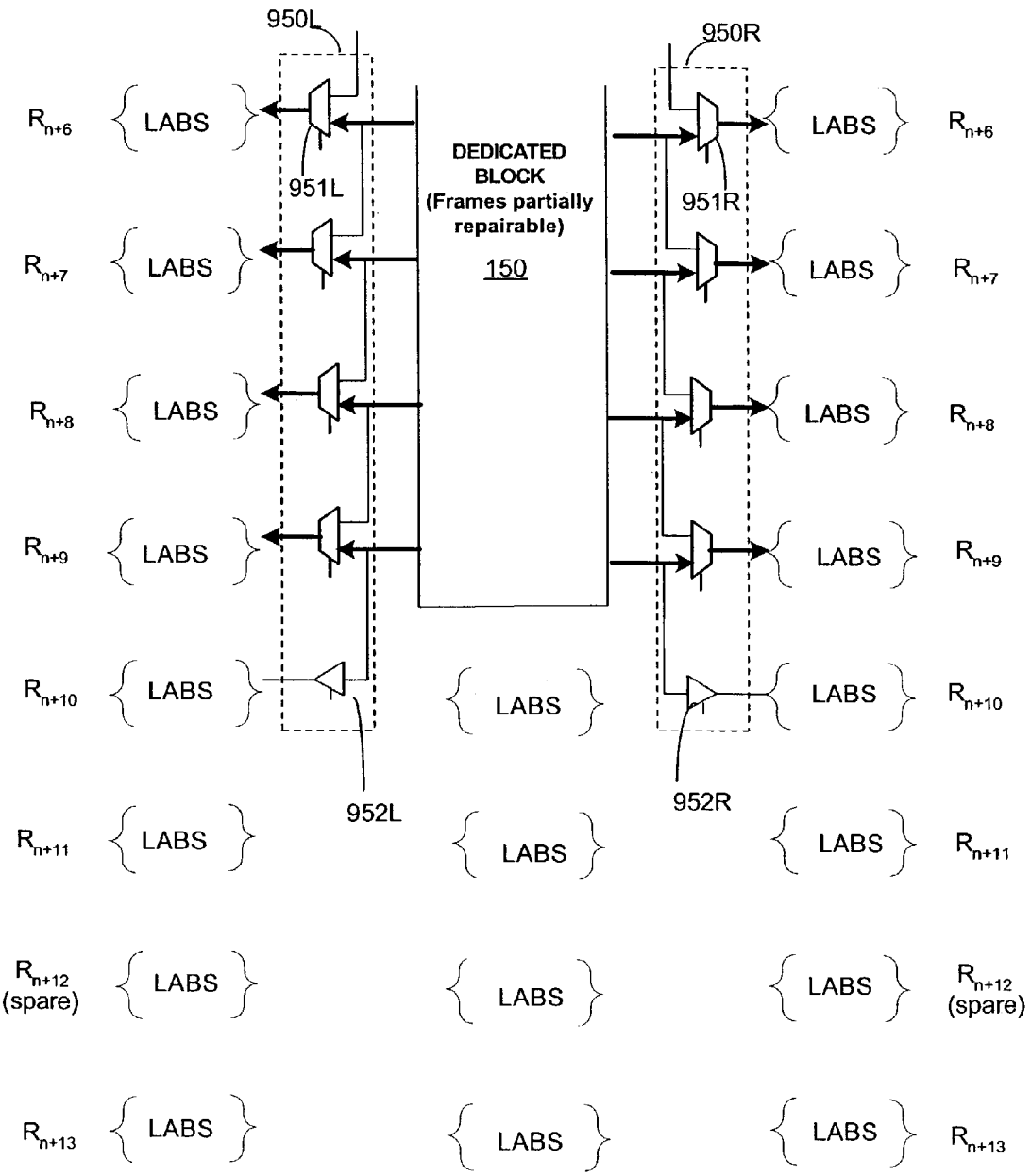

Referring to FIG. 9c, dedicated block 150 is also coupled to both a left output interface 950L, comprising muxes 951L and tri-state driver 952L, and a right output interface 950R, comprising muxes 951R and tri-state driver 952R. In a normal mode, muxes 951L, tri-state driver 952L, muxes 951R, and tri-state driver 952R are controlled to route signals straight from portions of block 150 to proximate rows as indicated by the bold arrows.

Figure 9D:
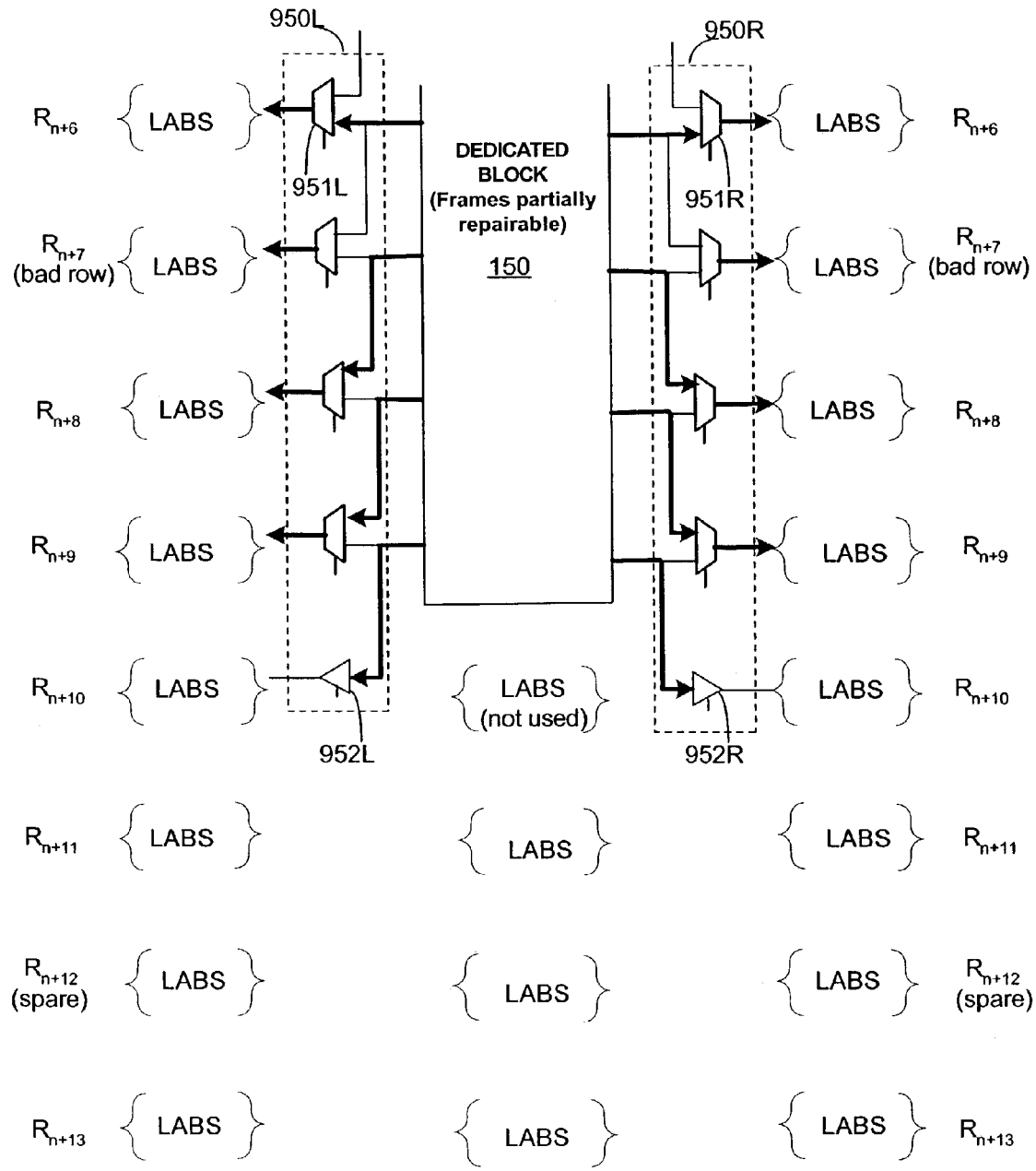

Referring to FIG. 9d, in a redundant mode, muxes 951L, tri-state driver 952L, muxes 951R, and tri-state driver 952R are controlled to route signals from the same portions of block 150 corresponding to rows Rn+7 to Rn+9 as routed from in normal mode, the signals are, in redundant mode, routed to the next rows below (i.e., respectively, rows Rn+8 to Rn+10) as indicated by the bold arrows.

Figure 10:
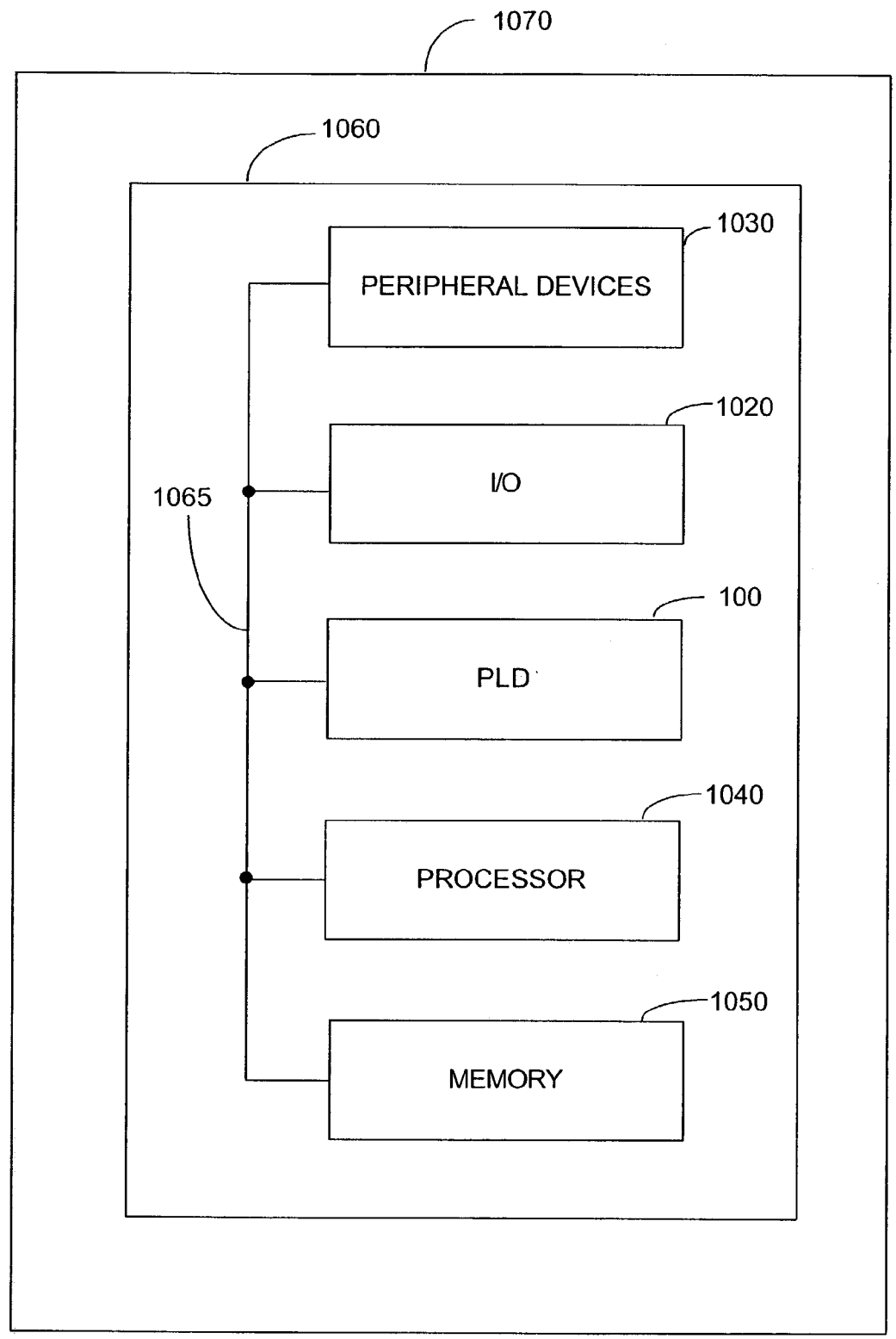
FIG. 10 illustrates a data processing system in which the PLD of FIG. 1 may be implemented.

FIG. 10 illustrates programmable logic device (PLD) 100 in a data processing system 1000. Data processing system 1000 may include one or more of the following components: a processor 1040; memory 1050; I/O circuitry 1020; and peripheral devices 1030. These components are coupled together by a system bus 1065 and are populated on a circuit board 1060 which is contained in an end-user system 1070. A data processing system such as system 1000 may include a single end-user system such as end-user system 1070 or may include a plurality of systems working together as a data processing system.

System 1000 can be used in a wide variety of applications, such as computer networking, data networking, instrumentation, video processing, digital signal processing, or any other application where the advantage of using programmable or reprogrammable logic is desirable. PLD 100 can be used to perform a variety of different logic functions. For example, programmable logic device 100 can be configured as a processor or controller that works in cooperation with processor 1040 (or, in alternative embodiments, a PLD might itself act as the sole system processor). PLD 100 may also be used as an arbiter for arbitrating access to a shared resources in system 1000. In yet another example, PLD 100 can be configured as an interface between processor 1040 and one of the other components in system 1000. It should be noted that system 1000 is only exemplary.

Although aspects of an embodiment of the present invention have been described in the context of a programmable logic device having a row-based redundancy scheme, the invention is equally applicable to programmable logic devices using column-based redundancy schemes. Because the terminology of rows and columns is relative to the orientation of the device, in a typical device having rows and columns perpendicular to each other, one may interchange the words row and column by merely rotating a device by 90 degrees. For clarity, the present invention is described and claimed in terms of row-based arrangements, but the present description and claims apply equally to column-based redundancy arrangements.

Furthermore, although the term "row" is typically associated with a straight-line arrangement of items, alternative embodiments may employ row arrangements that are curved, or partially curved, or that have occasional jogs or gaps without necessarily departing from the spirit and scope of the present invention. Devices including such rows may still accommodate redundancy schemes that are within the scope of the present invention.

Although particular embodiments have been described in detail and certain variants have been noted, various other modifications to the embodiments described herein may be made without departing from the spirit and scope of the present invention, thus, the invention is limited only by the appended claims.

What is claimed is:

1. A programmable logic device including regions operable in a normal mode or in a redundant mode comprising:
    a logic array of circuitry arranged in a plurality of rows and including a spare row of circuitry for use in the redundant mode;
    a dedicated block of circuitry configured to perform a dedicated logic function interposed in and coupled to the logic array; and
    control circuitry coupled to programming circuitry to control shifting of configuration data during programming of the logic array and the dedicated block such that configuration data provided to configuration elements for a first row of the logic array in the normal mode is provided to configuration elements for a second row of the logic array in the redundant mode and such that configuration elements for the dedicated block receive the same configuration data in both the normal and redundant modes.

2. The programmable logic device of claim 1 wherein the dedicated block spans portions of all rows of a repairable region of the logic array.

3. The programmable logic device of claim 1 wherein the dedicated block spans portions of less than all rows of a repairable region of the logic array.

4. The programmable logic device of claim 1 wherein the dedicated block is a first dedicated block and the programmable logic device further comprises a second dedicated block interposed in and coupled to the logic array, the first dedicated block spanning portions of a first number of rows of the logic array and the second dedicated block spanning portions of a second number of rows of the logic array.

5. The programmable logic device of claim 4 wherein the first number of rows is less than the number of rows of a repairable region of the logic array and the second number of rows is equal to the number of rows of a repairable region of the logic array.

6. A data processing system comprising the programmable logic device of claim 1.

7. A programmable logic dice including regions operable in a normal mode or in a redundant mode comprising:
    a logic array of circuitry arranged in a plurality of rows and including a spare row of circuitry for use in the redundant mode;
    a dedicated block of circuitry configured to perform a dedicated logic function interposed in and coupled to the logic array; and
    means for programming the logic array and the dedicated block such that configuration data for a fist row of the logic array in the normal mode is provided for a second row of the logic array in the redundant mode and such that the dedicated block receives the same configuration data in both the normal and redundant modes.

8. A programmable logic device comprising:
    a logic array of circuitry arranged in a plurality of rows and including a spare row of circuitry for use in a redundant mode;
    a dedicated block of circuitry configured to perform a dedicated logic function interposed in and coupled to the logic array;
    configuration elements coupled in a configuration grid and coupled to the logic array and the dedicated block;
    a data register coupled to the configuration grid to provide configuration data, frame-by-frame to the configuration elements;
    an address register coupled to the configuration grid to assert a frame of the configuration grid to receive configuration data from the data register; and
    detector circuitry coupled to the address register to detect frames of the configuration grid spanned by the dedicated block.

9. The programmable logic device of claim 8 wherein the detector circuitry comprises:
    a start detector coupled to the address register to detect the start of the dedicated block; and
    an end detector coupled to the address register to detect the end of the dedicated block.

10. The programmable logic device of claim 9 wherein:
    the start detector is coupled to an element of the address register that is coupled to a frame that, during a programming sequence, is asserted prior to assertion of a first frame spanning the dedicated block; and
    the end detector is coupled to an element of the address register that asserts a frame that, during a programming sequence, is asserted prior to assertion of a first frame that follows frames spanning the dedicated block.

11. The programmable logic device of claim 9 wherein:
    the start detector is coupled to selection circuitry that selectively couples the start detector to either of two first elements of the address register, the two first address register elements being coupled within the address register to assert frames during a selected programming or verification sequence prior to assertion of a first frame spanning the dedicated block; and
    the end detector is coupled to selection circuitry that selectively couples the start detector to either of two second elements of the address register, the two second address register elements being coupled within the address register to assert frames during a selected programming or verification sequence prior to assertion of a first frame that follows frames spanning the dedicated block.

12. A data processing system comprising the programmable logic device of claim 9.

13. A data processing system comprising the programmable logic device of claim 8.

14. A method of programming a configuration grid coupled to a logic array and a dedicated block configured to perform a dedicated logic function in a programmable logic device in a normal and a redundant mode, the method comprising:
    providing frames of data one at a time to the configuration grid;

detecting when during a programming sequence, frames including data for programming the dedicated block configured to perform the dedicated logic function will be provided to the configuration grid;

detecting rows of the logic array corresponding to the dedicated block; and row-shifting data provided to the grid for programming the logic array to bypass a bad row and utilize a spare row in the redundant mode without row-shifting shifting data provided to the dedicated block in the redundant mode.

15. The method of claim 14 wherein data is cleared in the redundant mode for the portion of the configuration grid corresponding to the logic circuitry of the logic array just below the dedicated block in the redundant mode.

16. A programmable logic device comprising:

programming means for providing frames of data one at a time to program a logic array and a dedicated block configured to perform a dedicated logic function in the programmable logic device;

means for detecting when frames including data for programming the dedicated block will be provided;

means for detecting rows of the logic array corresponding to the dedicated block; and means for row-shifting data for programming the logic array to bypass a bad row and utilize a spare row in the redundant mode without row-shifting shifting data provided for programming the dedicated block in the redundant mode.

17. A programmable logic device comprising:

a logic array of circuitry;

a dedicated block of circuitry configured to perform a dedicated logic function interposed in and coupled to the logic array;

configuration elements coupled in a configuration grid and coupled to the logic array and the dedicated block;

an address register coupled to the configuration grid to assert a frame of the configuration grid to receive configuration data from a data register; and control circuitry coupled to receive a detection signal from detection circuitry coupled to the address register, the control circuitry also being coupled to control shifting of configuration data loaded into the data register, the detection signal indicating data frames spanning a dedicated block.

18. The programmable logic device of claim 17 wherein:

the control circuitry includes a pipeline register coupled to register a second signal related to the detection signal and coupled to provide the second signal when needed for controlling configuration data shifting; and the detection circuitry is coupled to the address register to provide the detection signal to the control circuitry in advance of the second signal being needed for controlling configuration data shifting.

19. The programmable logic device of claim 18 wherein the second signal is the detection signal.

20. The programmable logic device of claim 18 wherein control circuitry further comprises first stage logic circuitry coupled to provide the second signal to the pipeline register and coupled to receive the detection signal and other signals.

21. The programmable logic device of claim 20 wherein the control circuitry further comprises second stage logic circuitry coupled to receive the second signal from the pipeline register and coupled to provide a control signal for controlling configuration data shifting.

22. A data processing system comprising the programmable logic device of claim 18.

23. The programmable logic device of claim 17 wherein the control circuitry is coupled to control shifting of configuration data to implement normal and redundant modes.

24. A control circuit for providing redundancy control signaling for implementing normal and redundant modes in a programmable logic device, the control circuit comprising:

a logic circuit coupled to a provide a first redundancy control signal to programming circuitry of the programmable logic device; and a first register coupled to receive the first redundancy control signal from the logic circuit, the register also being coupled to provide a registered value of the first redundancy control signal to routing circuitry of the programmable logic device.

25. The control circuit of claim 24 further comprising:

a first selector coupled to receive the registered value of the first redundancy control signal and to selectively provide the registered value to the routing circuitry.

26. The control circuit of claim 25 wherein the first selector is a first multiplexor and the first multiplexor is also coupled to receive the first redundancy control signal and to selectively provide either the first redundancy control signal or the registered value of the first redundancy control signal to the routing circuitry.

27. The control circuit of claim 26 wherein the routing circuitry routes to or from I/O pins and the multiplexor is programmable to provide the first redundancy control signal to the routing circuitry in a test programming or test verification mode and to provide the registered value of the first redundancy control signal to the routing circuitry in a user mode.

28. The control circuit of claim 27 wherein the logic circuit is also coupled to provide a second redundancy control signal to programming circuitry of the programmable logic device, the control circuit further comprising:

a second register coupled to receive the second redundancy control signal from the logic circuit, the register also being coupled to provide a registered value of the second redundancy control signal to core routing circuitry of the programmable logic device.

29. The control circuit of claim 28 further comprising:

a second selector coupled to the second register to receive the registered value of the second redundancy control signal and to selectively provide the registered value of the second redundancy control signal to the core routing circuitry.

30. The control circuit of claim 29 wherein the second selector is programmable to selectively provide the registered value of the second redundancy control signal to the core routing circuitry in the user mode.

31. The control circuit of claim 29 wherein the second selector is a second multiplexor and the second multiplexor is also coupled to receive the second redundancy control signal and to selectively provide either the second redundancy control signal or the registered value of the second redundancy control signal to the core routing circuitry.

32. The control circuit of claim 29 wherein the second selector is a tri-state driver.

33. A programmable logic device comprising the control circuit of claim 24.

34. A data processing system comprising the programmable logic device of claim 33.

35. A method for providing redundancy control signals during user and non-user modes of a programmable logic device:

providing a first redundancy control signal to programming circuitry during a programming sequence of the programmable logic device;

registering a value of the first redundancy control signal during or at an end of the programming sequence; and providing the registered value of the first redundancy control signal to redundancy routing circuitry of the programmable logic device during the user mode.

36. The method of claim 35 wherein the redundancy routing circuitry is I/O routing circuitry.

37. The method of claim 35 wherein the redundancy routing circuitry is core routing circuitry.

38. The method of claim 36 further comprising:

providing a second redundancy control signal to the programming circuitry during a programming sequence of the programmable logic device;

registering a value of the second redundancy control signal during or at an end of the programming sequence; and providing the registered value of the second redundancy control signal to core routing circuitry of the programmable logic device during the user mode.

39. The method of claim 35 further comprising:

utilizing the it redundancy control signal with the programming circuitry during a verification sequence operable in the user mode.

40. A control circuit for providing redundancy control signaling for implementing normal and redundant modes in a programmable logic device, the control circuit comprising:

means for providing a first redundancy control signal to programming circuitry during a programming sequence of the programmable logic device;

means for registering a value of the first redundancy control signal during or at an end of the programming sequence; and means for providing the registered value of the first redundancy control signal to redundancy routing circuitry of the programmable logic device during a user mode.

41. A programmable logic device including regions operable in a normal mode or in a redundant mode comprising:

a logic array of circuitry arranged in a plurality of rows and including a spare row of circuitry for use in the redundant mode;

a dedicated block of circuitry interposed in and coupled to the logic array; and interface switching circuitry coupled to the logic array and the dedicated block to route signals between the logic array and the dedicated block in normal and redundant modes.

42. The programmable logic device of claim 41 wherein the interface switching circuitry is adaptable to route signals between a first portion of the dedicated block and a first row of the logic array in a normal mode and between a first portion of the dedicated block and a second row of the logic array in a redundant mode.

43. The programmable logic device of claim 42 wherein the interface switching circuitry comprises input interface switching circuitry and output interface switching circuitry.

44. A data processing system comprising the programmable logic device of claim 41.

45. A programmable logic device including regions operable in a normal mode or in a redundant mode comprising:

a logic array of circuitry arranged in a plurality of rows and including a spare row of circuitry for use in the redundant mode;

a dedicated block of circuitry configured to perform a dedicated logic function interposed in and coupled to the logic array; and means coupled to the logic array and the dedicated block for routing signals between the logic array and the dedicated block in normal and redundant modes to accommodate redundant mode row-shifting of rows of the logic array.

* * * * *